US012787383B2

(12) United States Patent
Kim et al.

(10) Patent No.: US 12,787,383 B2
(45) Date of Patent: Nov. 3, 2026

(54) SEMICONDUCTOR DEVICES

(71) Applicant: SAMSUNG ELECTRONICS CO., LTD., Suwon-si (KR)

(72) Inventors: Jeewoong Kim, Suwon-si (KR); Hidenobu Fukutome, Suwon-si (KR); Jinkyu Kim, Suwon-si (KR); Yunsuk Nam, Suwon-si (KR); Dongyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 365 days.

(21) Appl. No.: 18/615,708

(22) Filed: Mar. 25, 2024

(65) Prior Publication Data

US 2024/0413204 A1 Dec. 12, 2024

(30) Foreign Application Priority Data

Jun. 9, 2023 (KR) ........................ 10-2023-0074071

(51) Int. Cl.
*H10D 62/10* (2025.01)
*H10D 30/43* (2025.01)
(Continued)

(52) U.S. Cl.
CPC ........... *H10D 62/121* (2025.01); *H10D 30/43* (2025.01); *H10D 30/6729* (2025.01);
(Continued)

(58) Field of Classification Search
CPC .. H10D 62/121; H10D 30/43; H10D 30/6729; H10D 30/6735; H10D 30/6757; H10D 64/258
See application file for complete search history.

(56) References Cited

U.S. PATENT DOCUMENTS 11,227,922 B2 1/2022 Li et al.
11,289,606 B2 3/2022 Ju et al.
(Continued)

FOREIGN PATENT DOCUMENTS

CN 113206062 A 8/2021

OTHER PUBLICATIONS

Communication dated Nov. 4, 2024, issued by the European Patent Office in European Application No. 24176790.4.

*Primary Examiner* — Samuel A Gebremariam
(74) *Attorney, Agent, or Firm* — Sughrue Mion, PLLC

(57) ABSTRACT

A semiconductor device includes: insulating patterns spaced apart from each other in a first direction and in a second direction that intersects the first direction; a substrate insulating layer on first side surfaces of the insulating patterns; a device isolation layer on second side surfaces of the insulating patterns; channel layers on the insulating patterns and spaced apart from each other in a vertical direction that is perpendicular to an upper surface of the device isolation layer; gate structures vertically overlapping the insulating patterns, surrounding each of the channel layers, and extending in the second direction; source/drain regions provided outside the gate structures; and backside contact structures electrically connected to the source/drain regions and provided below the source/drain regions, wherein the insulating patterns include protrusions protruding in the vertical direction from an upper surface of the device isolation layer, and, in a region in which the insulating patterns vertically overlap the gate structures, a vertical distance between a lower surface of a lowermost channel layer among the channel layers and an upper surface of the protrusions is greater than a vertical distance between the channel layers.

20 Claims, 21 Drawing Sheets

(51) Int. Cl.
*H10D 30/67* (2025.01)
*H10D 64/23* (2025.01)

(52) U.S. Cl.
CPC ..... *H10D 30/6735* (2025.01); *H10D 30/6757* (2025.01); *H10D 64/258* (2025.01)

(56) References Cited

U.S. PATENT DOCUMENTS

| | | | |
|---|---|---|---|
| 11,411,100 | B2 | 8/2022 | Wang et al. |
| 11,502,201 | B2 | 11/2022 | Yu et al. |
| 11,551,969 | B2 | 1/2023 | Yu et al. |
| 11,581,224 | B2 | 2/2023 | Su et al. |
| 2021/0359091 | A1 | 11/2021 | Hsu et al. |
| 2021/0375857 | A1 | 12/2021 | Huang et al. |
| 2021/0399099 | A1 | 12/2021 | Chu et al. |
| 2021/0408246 | A1 | 12/2021 | Ganguly et al. |
| 2021/0408247 | A1 | 12/2021 | Yu et al. |
| 2021/0408249 | A1 | 12/2021 | Yu et al. |
| 2022/0130823 | A1 | 4/2022 | Su et al. |
| 2022/0139911 | A1 | 5/2022 | Wei et al. |
| 2022/0238660 | A1 | 7/2022 | Huang et al. |
| 2022/0359679 | A1 | 11/2022 | Lu et al. |
| 2022/0359700 | A1 | 11/2022 | Chung et al. |
| 2023/0026310 | A1 | 1/2023 | Chang et al. |
| 2023/0064183 | A1 | 3/2023 | Parikh et al. |
| 2023/0068312 | A1 | 3/2023 | Parikh et al. |
| 2023/0086033 | A1 | 3/2023 | Xie et al. |
| 2023/0093101 | A1 | 3/2023 | Xie et al. |

SEMICONDUCTOR DEVICES

CROSS-REFERENCE TO RELATED APPLICATION

This application claims priority to Korean Patent Application No. 10-2023-0074071, filed on Jun. 9, 2023, in the Korean Intellectual Property Office, the disclosure of which is incorporated by reference herein in its entirety.

BACKGROUND

The present disclosure relates to semiconductor devices.

With increasing demand for high performance, high speed, and/or the multifunctionalization of semiconductor devices, the degree of integration of semiconductor devices is also increasing. According to a trend for high integration of semiconductor devices, a semiconductor device having a BackSide Power Delivery Network (BSPDN) structure in which a power rail is provided on a rear surface of a wafer is being developed. Furthermore, efforts are being made to develop semiconductor devices having channels with a three-dimensional structure in order to overcome the limitations of operating characteristics due to a reduction in a size of a planar metal oxide semiconductor FET (MOSFET).

SUMMARY

Example embodiments provide semiconductor devices having improved electrical characteristics and reliability.

According to an aspect of an example embodiment, a semiconductor device includes: insulating patterns spaced apart from each other in a first direction and in a second direction that intersects the first direction; a substrate insulating layer on first side surfaces of the insulating patterns; a device isolation layer on second side surfaces of the insulating patterns; channel layers on the insulating patterns and spaced apart from each other in a vertical direction that is perpendicular to an upper surface of the device isolation layer; gate structures vertically overlapping the insulating patterns, surrounding each of the channel layers, and extending in the second direction; source/drain regions provided outside the gate structures; and backside contact structures electrically connected to the source/drain regions and provided below the source/drain regions, wherein the insulating patterns include protrusions protruding in the vertical direction from an upper surface of the device isolation layer, and, in a region in which the insulating patterns vertically overlap the gate structures, a vertical distance between a lower surface of a lowermost channel layer among the channel layers and an upper surface of the protrusions is greater than a vertical distance between the channel layers.

According to an aspect of an example embodiment, a semiconductor device includes: insulating patterns spaced apart from each other in a first direction and in a second direction that intersects the first direction; a substrate insulating layer on first side surfaces of the insulating patterns; a device isolation layer on second side surface of the insulating patterns; a channel layers on the insulating patterns and spaced apart from each other in a vertical direction that is perpendicular to an upper surface of the device isolation layer; gate structures vertically overlapping the insulating patterns, surrounding each of the channel layers, and extending in the second direction; source/drain regions provided outside the gate structures; and contact structures connected to the source/drain regions, wherein the source/drain regions include: a first source/drain region on the substrate insulating layer and vertically overlapping the substrate insulating layer; and a second source/drain region spaced apart from the first source/drain region in the first direction, wherein the contact structures include: a first contact structure above the first source/drain region and connected to the first source/drain region; and a second contact structure connected to the second source/drain region and penetrating through the insulating patterns below the second source/drain region, and wherein the insulating patterns partially penetrate through lower portions of the gate structures.

According to an aspect of an example embodiment, a semiconductor device includes: insulating patterns spaced apart from each other; channel layers on the insulating patterns and spaced apart from each other; gate structures vertically overlapping the insulating patterns and surrounding each of the channel layers; source/drain regions provided outside the gate structures; and backside contact structures electrically connected to the source/drain regions below the source/drain regions, wherein the insulating patterns include protrusions partially penetrating through lower portions of the gate structures, and, in a region in which the insulating patterns vertically overlap the gate structures, a vertical distance between a lower surface of a lowermost channel layer among the channel layers and an upper surface the protrusions is greater than a vertical distance between the channel layers.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
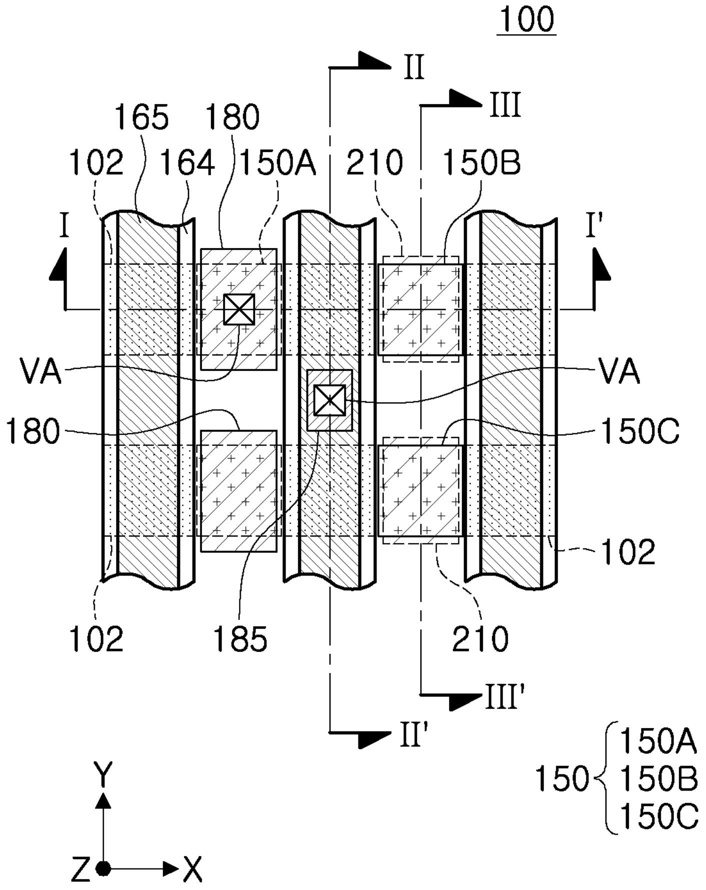
FIG. 1 is a plan view illustrating a semiconductor device example according to one or more example embodiments.

Hereinafter, example embodiments will be described with reference to the accompanying drawings. Hereinafter, it may be understood that the expressions such as “on,” “above,” “upper,” “below”, “beneath,” “lower,” and “side,” merely describe one or more example embodiments as shown in the drawings. The same reference numerals are used for the same components in the drawings, and duplicate descriptions thereof are omitted.

FIG. 1 is a plan view illustrating a semiconductor device according to one or more example embodiments.

Figure 2:
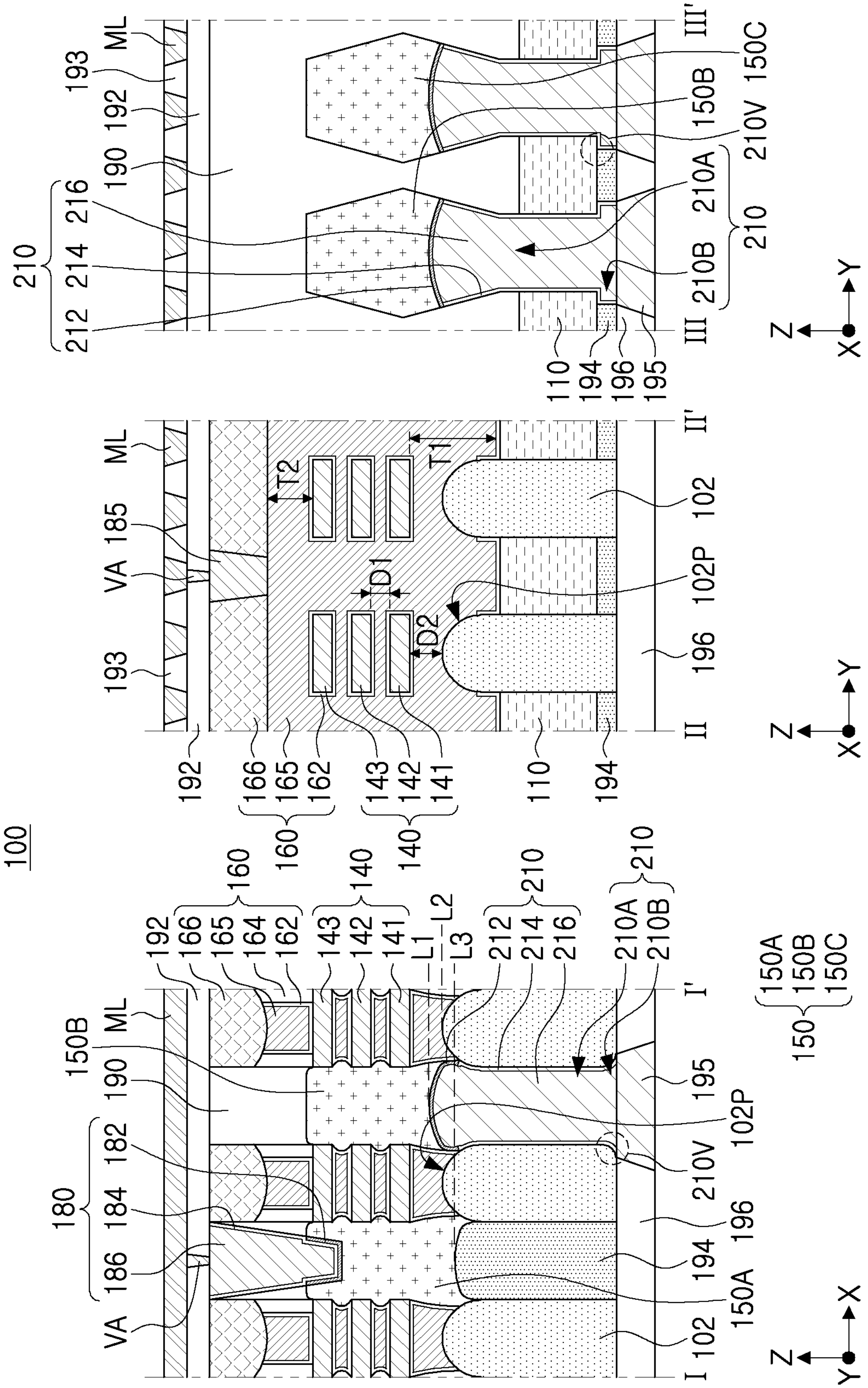
FIG. 2 shows schematic cross-sectional views illustrating a semiconductor device according to one or more example embodiments.

FIG. 2 shows schematic cross-sectional views illustrating a semiconductor device according to one or more example embodiments. FIG. 2 illustrates cross-sections taken along cutting lines I-I', II-II', and III-III' of the semiconductor device of FIG. 1, respectively. For convenience of description, only the main components of the semiconductor device are illustrated in FIGS. 1 and 2.

Referring to FIGS. 1 and 2, a semiconductor device 100 may include insulating patterns 102, a device isolation layer 110 provided on side surfaces of the insulating patterns 102, a substrate insulating layer 194, a channel structure including first, second and third channel layers 141, 142 and 143 spaced vertically apart from each other on the insulating patterns 102, gate structures 160 vertically overlapping the insulating patterns 102, surrounding each of a plurality of channel layers 141, 142 and 143, and extending in a Y-direction, source/drain regions 150 in contact with the channel structures 140, and contact structures 180 and 210 connected to the source/drain regions 150. The semiconductor device 100 may further include a gate contact structure 185, an interlayer insulating layer 190, first and second upper insulating layers 192 and 193, a lower insulating layer 196, a via VA, a metal wiring ML, and a backside power structure 195.

The insulating patterns 102 may be spaced apart from each other in a first direction (e.g., an X-direction) and a second direction (e.g., a Y-direction), intersecting the first direction. The insulating patterns 102 may be provided in a region from which an active region 105, further described below, is removed. The device isolation layer 110 may be provided between adjacent insulating patterns 102 in the Y-direction. Upper surfaces of the insulating patterns 102 may be provided on a different level from that of an upper surface of the device isolation layer 110, but the present disclosure embodiments are not limited thereto. to this example configuration. The insulating patterns 102 may include, for example, an oxide, a nitride, or a combination thereof.

The insulating patterns 102 may include a protrusion 102P partially penetrating through lower portions of the gate structures 160. According to one or more example embodiments, the insulating patterns 102 may include protrusions 102P protruding from the upper surface of the device isolation layer 110 in a vertical direction (e.g., in a Z-direction). Cross-sections of the protrusions 102P in the X-direction may have various shapes. According to one or more example embodiments, cross-sections of the protrusions 102P in the X-direction may be at least one of a dome shape and a mushroom shape. Furthermore, the cross-section of the protrusions 102P in the Y-direction may be at least one of a dome shape and a mushroom shape. The shapes of the cross-sections of the protrusions 102P in the X-direction may be independent from the cross-section thereof in the Y-direction.

The insulating patterns 102 may partially penetrate through lower portions of the gate structures 160. The insulating patterns 102 may vertically overlap the plurality of channel layers 141, 142 and 143, and may be provided below the plurality of channel layers 141, 142 and 143 to be spaced apart from the plurality of channel layers 141, 142 and 143. According to one or more example embodiments, a vertical distance D2 between an upper surface of the insulating patterns 102 and a lower surface of a lowermost channel layer 141 among the plurality of channel layers 141, 142 and 143 may be greater than a vertical distance D1 between the plurality of channel layers 141, 142 and 143. For example, the vertical distance D2 between an uppermost end of the insulating patterns 102 and a lower surface of the lowermost channel layer 141, from among the plurality of channel layers 141, 142 and 143, may be greater than the vertical distance D1 between the plurality of channel layers 141, 142 and 143. According to one or more example embodiments, in a region in which the insulating patterns 102 and the gate structures 160 vertically overlap each other, the vertical distance D2 between the lower surface of the lowermost channel layer 141 among the plurality of channel layers 141, 142 and 143 and the protrusions 102P may be greater than the vertical distance D1 between the plurality of channel layers 141, 142 and 143.

The device isolation layer 110 may be provided on the side surfaces of the insulating patterns 102 in the Y-direction. The device isolation layer 110 may be provided by, for example, a shallow trench isolation (STI) process. According to one or more example embodiments, the device isolation layer 110 may be provided on side surfaces of the backside contact structures 210, further described below. The device isolation layer 110 may comprise an insulating material. The device isolation layer 110 may be, for example, an oxide, a nitride, or a combination thereof.

The substrate insulating layers 194 may be provided on the side surfaces of the insulating patterns 102 in the X-direction. The substrate insulating layers 194 may be spaced apart from each other by the insulating patterns 102 or the backside contact structures 210 in the Y-direction, but embodiments are not limited to this example configuration. The substrate insulating layer 194 may extend in the Y-direction. The substrate insulating layer 194 may be a layer provided by removing and/or oxidizing a substrate 101 comprising a semiconductor material (see FIG. 9A) during a manufacturing process. The substrate insulating layer 194 may comprise an insulating material, for example, an oxide, a nitride, or a combination thereof. According to one or more example embodiments, the substrate insulating layer 194 may include a plurality of insulating layers.

According to one or more example embodiments, a level L3 of a surface in which the substrate insulating layer 194 and a first source/drain region 150A are in contact with each other may be lower than a level L2 of an uppermost end of each of the protrusions 102P. The substrate insulating layer 194 may cover a lower surface of the device isolation layer 110 and a side surface of a second portion 210B, but embodiments are not limited this example configuration.

The channel structures 140 may be provided on insulating patterns 102 to cross the gate structures 160. Each of the channel structures 140 may include first, second and third channel layers 141, 142 and 143, which comprise two or more channel layers spaced apart from each other in the Z-direction. The channel structures 140 may be connected to the source/drain regions 150. The channel structures 140 may have a width equal to or similar to that of the gate structures 160 in the X-direction. In a cross-section in the Y-direction, a channel layer provided in a lower portion among the first, second and third channel layers 141, 142 and 143 may have a width equal to or greater than a width of a channel layer provided in an upper portion among the first, second and third channel layers 141, 142 and 143. However, according to one or more example embodiments, the first, second and third channel layers 141, 142 and 143 may have a reduced width so that side surfaces thereof are provided below the gate structure 160 in the X-direction. Accordingly, a contact area with which the source/drain regions 150 and the plurality of channel layers 141, 142 and 143 are in contact may be reduced.

The channel structures 140 may comprise a semiconductor material, and may include at least one of silicon (Si), silicon germanium (SiGe), and germanium (Ge). The number and shape of channel layers constituting one channel structure 140 may be variously changed in one or more example embodiments.

In the semiconductor device 100, a gate electrode 165 may be provided between the first, second and third channel layers 141, 142 and 143 of the channel structures 140 and may be provided on the channel structures 140. Accordingly, the semiconductor device 100 may include a transistor having a multibridge channel FET (MBCFET™) structure, which is a gate-all-around type field effect transistor. One or more example embodiments may also be applied to a transistor having a three dimensional-stacked FET (3D-SFET) structure that vertically stacks a plurality of transistors.

The gate structures 160 may be provided to vertically overlap the insulating patterns 102 and may extend in one direction, for example, in the Y-direction. Channel regions of transistors may be provided in the channel structure 140 crossing the gate electrode 165 of the gate structures 160. The gate structures 160 may be spaced apart from each other in the X-direction. Each of the gate structures 160 may include gate dielectric layers 162, gate spacer layers 164, a gate electrode 165, and a gate capping layer 166 on an upper surface of the gate electrode 165.

The gate dielectric layers 162 may be provided between the gate electrode 165 and the source/drain regions 150, and between the channel structure 140 and the gate electrode 165, and may be provided to cover at least some of the surfaces of the gate electrode 165. The gate dielectric layers 162 may cover the upper surface of the device isolation layer 110. For example, the gate dielectric layers 162 may be provided to surround all surfaces except an uppermost surface of the gate electrode 165. The gate dielectric layers 162 may extend between the gate electrode 165 and the gate spacer layers 164, but embodiments are not limited to this example configuration. The gate dielectric layer 162 may include an oxide, a nitride, or a high-K material. The high-K material may denote a dielectric material with a higher dielectric constant than that of a silicon oxide film ($SiO_2$). The high-K material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_x$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). According to one or more example embodiments, the gate dielectric layer 162 may have a multilayer structure.

The gate electrode 165 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. According to one or more example embodiments, the gate electrode 165 may have a multilayer structure. The gate electrode 165 may be connected to the gate contact structure 185.

The gate spacer layers 164 may be provided on both side surfaces of the gate electrode 165 on the channel structure 140. The gate spacer layers 164 may insulate the source/drain regions 150 from the gate electrodes 165. According to one or more example embodiments, a shape of an upper end of the gate spacer layers 164 may be variously changed, and the gate spacer layer 164 may have a multilayer structure. The gate spacer layers 164 may include at least one of an oxide, a nitride, and an oxynitride, for example, and may comprise a low dielectric constant film.

Figure 9A:
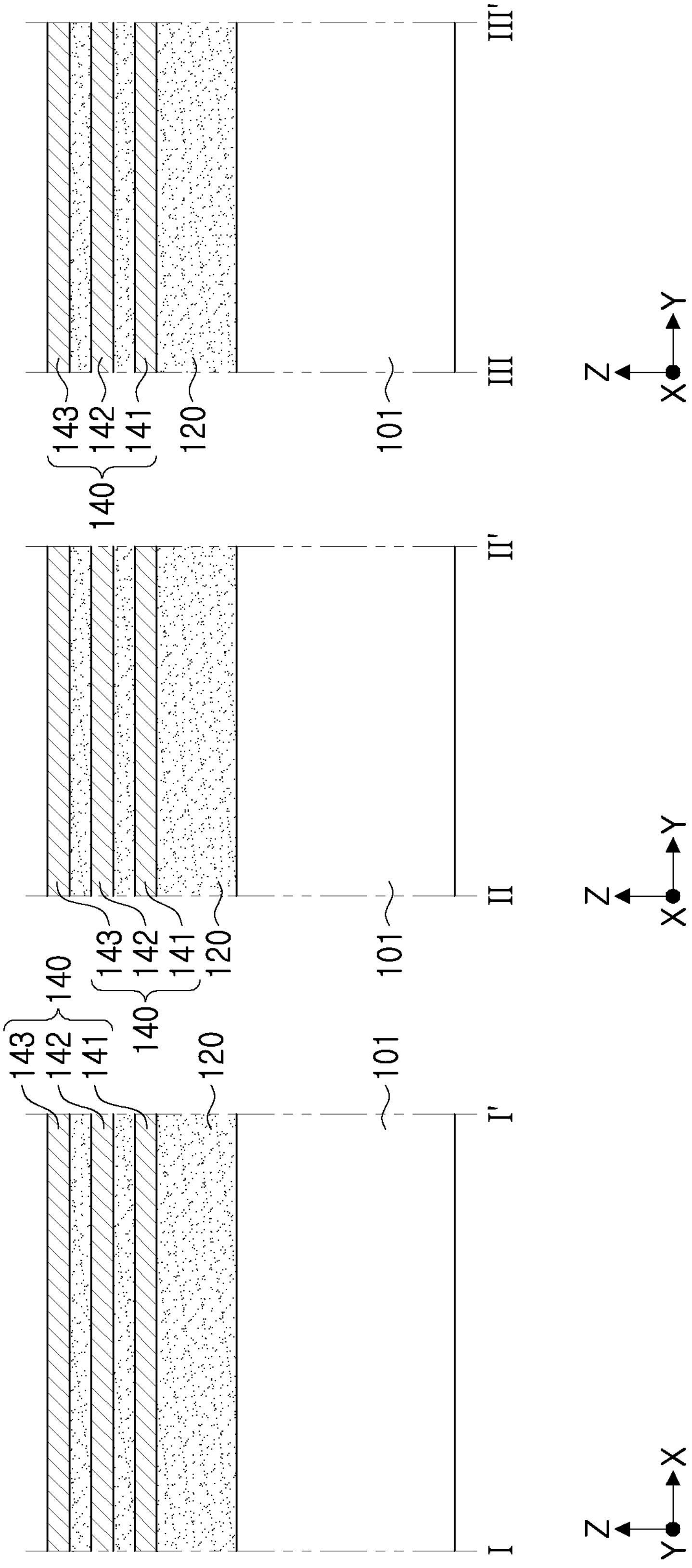
FIGS. 9A, 9B, 9C, 9D, 9E, 9F, 9G, 9H, 9I, 9J, 9K, 9L and 9M show cross-sectional views illustrating a method of manufacturing a semiconductor device example according to one or more example embodiments according to a process order.

According to one or more example embodiments, a lowermost sacrificial layer 120 may be thicker than other sacrificial layers 120 in FIG. 9A, and accordingly, in a region in which the gate structure 160 and the plurality of channel layers 141, 142 and 143 vertically overlap each other, a vertical distance T1 between a lower surface of the lowest channel layer 141 and the upper surface of the device isolation layer 110 may be greater than a vertical distance T2 between an uppermost surface of the gate electrode 165 and an upper surface of the uppermost channel layer 143, from among the plurality of channel layers 141, 142 and 143. However, embodiments are not limited to this example configuration. The vertical distance T1 between the lower surface of the lowermost channel layer 141 and the upper surface of the device isolation layer 110 may denote a vertical distance between a level of the lower surface of the lowermost channel layer 141 and a level of the upper surface of the device isolation layer 110.

The source/drain regions 150 may be provided on both sides of the gate structures 160 to be in contact with the channel structures 140, respectively. The source/drain regions 150 may be provided as a source region or a drain region of a transistor. The source/drain regions 150 may include a first source/drain region 150A vertically overlapping the substrate insulating layer 194 and may be provided on the substrate insulating layer 194, and a second source/drain region 150B may be spaced apart from the first source/drain region 150A in the X-direction. The source/drain regions 150 may further include a third source/drain region 150C spaced apart from the second source/drain region 150B in the Y-direction. The second and third source/drain regions 150B and 150C may be connected to the backside contact structures 210 through a lower surface or a lower end thereof. A lower region of the first source/drain region 150A may have a shape recessed by the substrate insulating layer 194, and lower regions of the second and third source/drain regions 150B and 150C may have a shape recessed by the backside contact structures 210. The second and third source/drain regions 150B and 150C may be electrically connected to the backside power structure 195 through the backside contact structures 210 to receive power. An upper surface of the source/drain regions 150 may be provided at a height equal to or similar to a lower surface of the gate electrode 165 on the channel structure 140, and the height may be variously changed in one or more example embodiments.

The source/drain regions 150 may include a semiconductor material, for example, at least one of silicon (Si) and germanium (Ge), and may further include impurities.

When the semiconductor device 100 is a pFET, the impurities may be at least one of boron (B), gallium (Ga), and indium (In), and when the semiconductor device 100 is an nFET, the impurities may be at least one of phosphorus (P), arsenic (As), and antimony (Sb).

The source/drain regions 150 may include epitaxial layers provided along a side surface of each of the first, second and third channel layers 141, 142 and 143 of the channel structure 140. The source/drain regions 150 may include a plurality of epitaxial layers, but embodiments are not limited to this example configuration. The source/drain regions 150 may comprise a semiconductor layer including silicon (Si) and/or germanium (SiGe). The source/drain regions 150 may include impurities of different types and/or concentrations. For example, the source/drain regions 150 may include silicon (Si) doped in an N-type and/or silicon germanium (SiGe) doped in a P-type. According to one or more example embodiments, the first and second source/drain regions 150A, 150B may include silicon germanium (SiGe) doped in a P-type, and the third source/drain region 150C may include silicon (Si) doped in an N-type, but embodiments are not limited to this example configuration. According to one or more example embodiments, the source/drain regions 150 may include a plurality of regions including elements and/or doped elements having different concentrations. The source/drain regions 150 may have a circular, elliptical, pentagonal, hexagonal, or similar cross-section in the Y-direction. However, in one or more example embodiments, the source/drain regions 150 may have various shapes, for example, any one of a polygon, a circle, and a rectangle.

The contact structures 180 and 210 may be connected to the source/drain regions 150. According to one or more example embodiments, the contact structures 180 and 210 may include a first contact structure 180 connected to the first source/drain region 150A above the first source/drain region 150A, and a second contact structures 210 penetrating through the insulating patterns 102 below the second source/drain region 150B and connected to the second source/drain region 150B. The second contact structures 210 may not vertically overlap the first contact structure 180. According to one or more example embodiments, the second contact structures 210 may be referred to as the backside contact structures 210.

The first contact structure 180 may penetrate through at least a portion of the interlayer insulating layer 190 to come into contact with the first source/drain region 150A, and may apply an electrical signal to the first source/drain region 150A. The first contact structure 180 may be provided on the first source/drain region 150A, and according to one or more example embodiments, the first contact structure 180 may be provided to have a length longer than a length of the first source/drain region 150A in the Y-direction. The first contact structure 180 may have an inclined side surface in which a width of a lower portion thereof is narrower than a width of an upper portion thereof according to an aspect ratio, but embodiments are not limited to this example configuration. The first contact structure 180 may be provided to recess the first source/drain region 150A by a predetermined depth.

The first contact structure 180 may include a first metal-semiconductor compound layer 182 provided on the bottom of the first contact structure 180, a barrier layer 184 provided along sidewalls of the first contact structure 180, and a plug conductive layer 186. The first metal-semiconductor compound layer 182 may comprise, for example, a metal silicide layer. The barrier layer 184 may include, for example, a metal nitride such as titanium nitride (TiN), tantalum nitride (TaN), or tungsten nitride (WN). The plug conductive layer 186 may include, for example, a metal material such as aluminum (Al), tungsten (W), or molybdenum (Mo). In one or more example embodiments, the first contact structure 180 may be provided to penetrate through at least a portion of the first source/drain region 150A. In one or more example embodiments, the number and arrangement shape of conductive layers comprising the first contact structure 180 may be variously changed. Furthermore, a wiring structure such as a contact plug may be provided on the gate electrode 165, and a wiring structure including a via VA and a metal wiring ML connected to the first contact structure 180 may be provided on the first contact structure 180.

The backside contact structures 210 may be provided under the source/drain regions 150. According to one or more example embodiments, the backside contact structures 210 may be electrically connected to the second and third source/drain regions 150B and 150C below the second and third source/drain regions 150B and 150C.

The backside contact structures 210 may extend vertically by penetrating through the insulating patterns 102. Side surfaces of the backside contact structures 210 may contact side surfaces of the insulating patterns 102. The backside contact structures 210 may comprise a self-align contact (SAC) aligned by the insulating patterns 102. Accordingly, a contact margin between the backside contact structures 210 and the source/drain regions 150 may be secured. The backside contact structures 210 may be connected to the second and third source/drain regions 150B and 150C by penetrating through the insulating patterns 102. The backside contact structures 210 may be provided to partially recess lower regions of the second and third source/drain regions 150B and 150C and may come into contact with recessed lower surfaces of the second and third source/drain regions 150B and 150C. A level of an upper end of the backside contact structures 210 may be higher than a level of a lower end of the second and third source/drain regions 150B and 150C. According to one or more example embodiments, a level L1 of an uppermost end of the backside contact structures 210 may be higher than a level L2 of an uppermost end of the insulating patterns 102 and may be lower than a level of a lower surface of the lowermost channel layer among the plurality of channel layers 141, 142 and 143. An upper surface of the backside contact structures 210 may be provided on a level higher than a level of a surface on which the substrate insulating layer 194 and the first source/drain region 150A are in contact with each other. According to one or more example embodiments, the level L1 of the uppermost end of the backside contact structures 210 may be higher than a level L3 of an uppermost end of the substrate insulating layer 194.

According to one or more example embodiments, because the lowermost sacrificial layer 120 may be provided to be thicker than other sacrificial layers 120 in FIG. 9A, the level L1 of the uppermost end of each of the backside contact structures 210 may be lower than a level of a lower surface of the lowermost channel layer 141. The level L1 of the uppermost end of each of the backside contact structures 210 may be higher than a level L2 of an uppermost end of each of the protrusions 102P.

The backside contact structures 210 may be in contact with the gate dielectric layer 162, but embodiments are not limited to this example configuration. The backside contact structures 210 may be spaced apart from the gate electrode 165 by the gate dielectric layer 162.

The backside contact structures 210 may include a first portion 210A provided on a level higher than a level of the lower surface of the device isolation layer 110 and a second portion 210B provided on a lower level than a level of the lower surface of the device isolation layer 110. The backside contact structures 210 may include a portion in which a width of the first portion 210A increases because it is provided in a region from which a partial lower portion of the second and third source/drain regions 150B and 150C is removed. The backside contact structures 210 may have a bend portion 210V for connecting the first portion 210A and the second portion 210B. The bend portion 210V may have an angular shape in a cross-section, but embodiments are not limited to this example configuration. The bend portion 210V may be provided along a circumference of the backside contact structures 210. Accordingly, widths of the backside contact structures 210 may be discontinuously reduced from above and below, based on the bend portion 210V. According to one or more example embodiments, a width of the second portion 210B may be greater than the width of the first portion 210A.

The backside contact structures 210 may include a liner layer 214, a second metal-semiconductor compound layer 212, and a conductive layer 216. The liner layer 214 may form an external surface of the backside contact structures 210 and may form a portion of the upper surface of the backside contact structures 210. However, an extension range of the liner layer 214 may be variously changed in one or more example embodiments. The liner layer 214 may include, for example, a metal nitride such as titanium nitride (TiN), tantalum nitride (TaN), or tungsten nitride (WN).

The second metal-semiconductor compound layer 212 may be provided on an upper end of the backside contact structures 210 and may form at least a portion of the upper surface of the backside contact structures 210. The second metal-semiconductor compound layer 212 may be provided on a surface on which the backside contact structures 210 is in contact with the source/drain regions 150. However, in one or more example embodiments, a range of the second metal-semiconductor compound layer 212 is not limited to the example configuration illustrated. The second metal-semiconductor compound layer 212 may comprise, for example, a metal silicide layer. The conductive layer 216 may be provided to fill a contact hole surrounded by the liner layer 214 and the second metal-semiconductor compound layer 212. The conductive layer 216 may include, for example, a metal material such as aluminum (Al), tungsten (W), or molybdenum (Mo). In one or more example embodiments, the number and arrangement shape of conductive layers constituting the backside contact structures 210 may be variously changed. In some one or more example embodiments, the liner layer 214 and/or the second metal-semiconductor compound layer 212 may be omitted.

The gate contact structure 185 may penetrate through the gate capping layer 166 in a vertical direction, for example, in the Z-direction, and may be connected to the gate electrode 165. The gate contact structure 185 may include a metal nitride such as titanium nitride (TiN), tantalum nitride (TaN), or tungsten nitride (WN) but embodiments are not limited to this example configuration. The gate contact structure 185 may include a metal material, such as at least one of aluminum (Al), copper (Cu), tungsten (W), cobalt (Co), ruthenium (Ru), and molybdenum (Mo).

The interlayer insulating layer 190 may be provided to cover the source/drain regions 150, the gate structure 160, and the device isolation layer 110. The interlayer insulating layer 190 may include, for example, at least one of an oxide, a nitride, an oxide, and a low-K dielectric.

The first upper insulating layer 192 may be provided to cover the interlayer insulating layer 190 and the gate structure 160. The second upper insulating layer 193 may be provided on the first upper insulating layer 192. The lower insulating layer 196 may be provided to cover the insulating patterns 102 and the substrate insulating layer 194. The first and second upper insulating layers 192 and 193 and the lower insulating layer 196 may include at least one of an oxide, a nitride, and an oxynitride, for example, and may comprise a low dielectric constant material. According to one or more example embodiments, each of the first and second interlayer insulating layers 192 and 193 and the lower insulating layer 196 may include a plurality of insulating layers.

The via VA may penetrate through the first upper insulating layer 192. The via VA may be connected to the first contact structure 180 or the gate contact structure 185. The via VA may comprise a conductive material.

The metal wiring ML may constitute a back end of line (BEOL) together with the via VA. The metal wiring ML and the via VA may be provided to a wiring portion for signal transmission. According to one or more example embodiments, a signal network may be configured by being connected to device regions (e.g., the source/drain regions 150 and the gate electrode 165) through the first contact structure 180 or the gate contact structure 185 from the metal wiring ML and the via VA.

The backside power structure 195 may be connected to a lower end or a lower surface of the backside contact structures 210. The backside power structure 195 may form a BSPDN that applies power or ground voltage, along with the backside contact structures 210, and may also be referred to as a rear power rail or a buried power rail. For example, the backside power structure 195 may be a buried wiring line extending in one direction, for example, in the Y-direction, from the bottom of the backside contact structures 210, but the shape of the backside power structure 195 is not limited to this example configuration. For example, in one or more example embodiments, the backside power structure 195 may include a via region and/or a line region. A width of the backside power structure 195 may be constant as the backside power structure 195 extends downward, but embodiments are not limited to this example configuration and the width of the backside power structure 195 may be continuously increased as the backside power structure 195 extends downward. The backside power structure 195 may include a conductive material, for example, at least one of tungsten (W), copper (Cu), aluminum (Al), cobalt (Co), ruthenium (Ru), titanium (Ti), and molybdenum (Mo).

Figure 3:
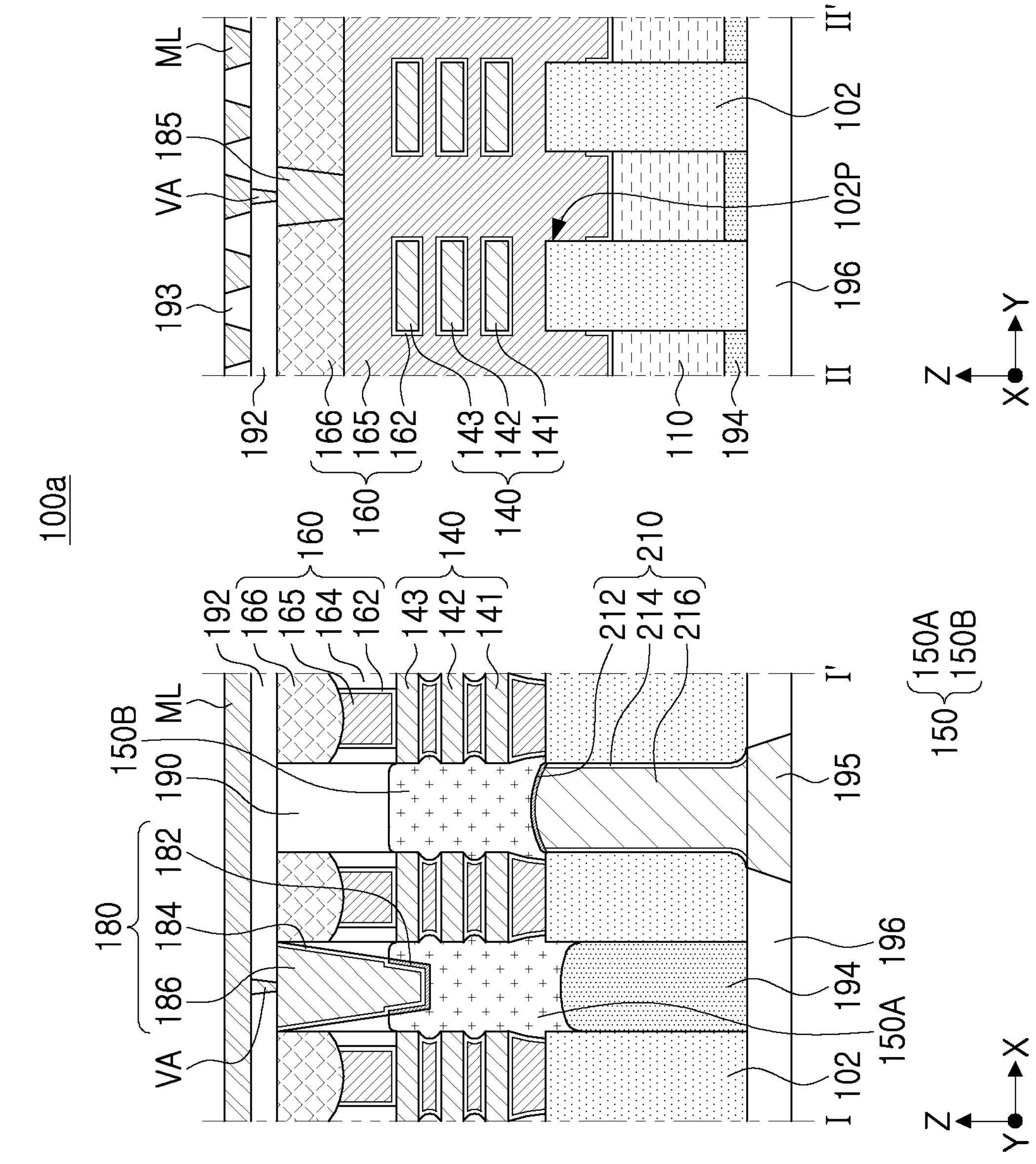
FIG. 3 shows schematic cross-sectional views illustrating a semiconductor device according to one or more example embodiments.

FIG. 3 shows schematic cross-sectional views illustrating a semiconductor device 100*a* according to one or more example embodiments. FIG. 3 illustrates regions corresponding to the cross-sections taken along lines I-I' and II-II' of FIG. 2.

Referring to FIG. 3, in a semiconductor device 100*a*, a cross-section of protrusions 102P in the X-direction may have a rectangular shape. A cross-section of the protrusions 102P in the Y-direction may have a rectangular shape. According to one or more example embodiments, backside contact structures 210 may be spaced apart from a gate structure 160 by insulating patterns 102 and source/drain regions 150. The source/drain regions 150 may be in contact with a substrate insulating layer 194 and the insulating patterns 102. Because a gate electrode 165 and the backside contact structures 210 are spaced apart from each other by an appropriate distance, a short margin may be secured between the backside contact structures 210 and the gate electrode 165. Accordingly, the semiconductor device 100*a* having improved electrical characteristics may be provided.

Figure 4:
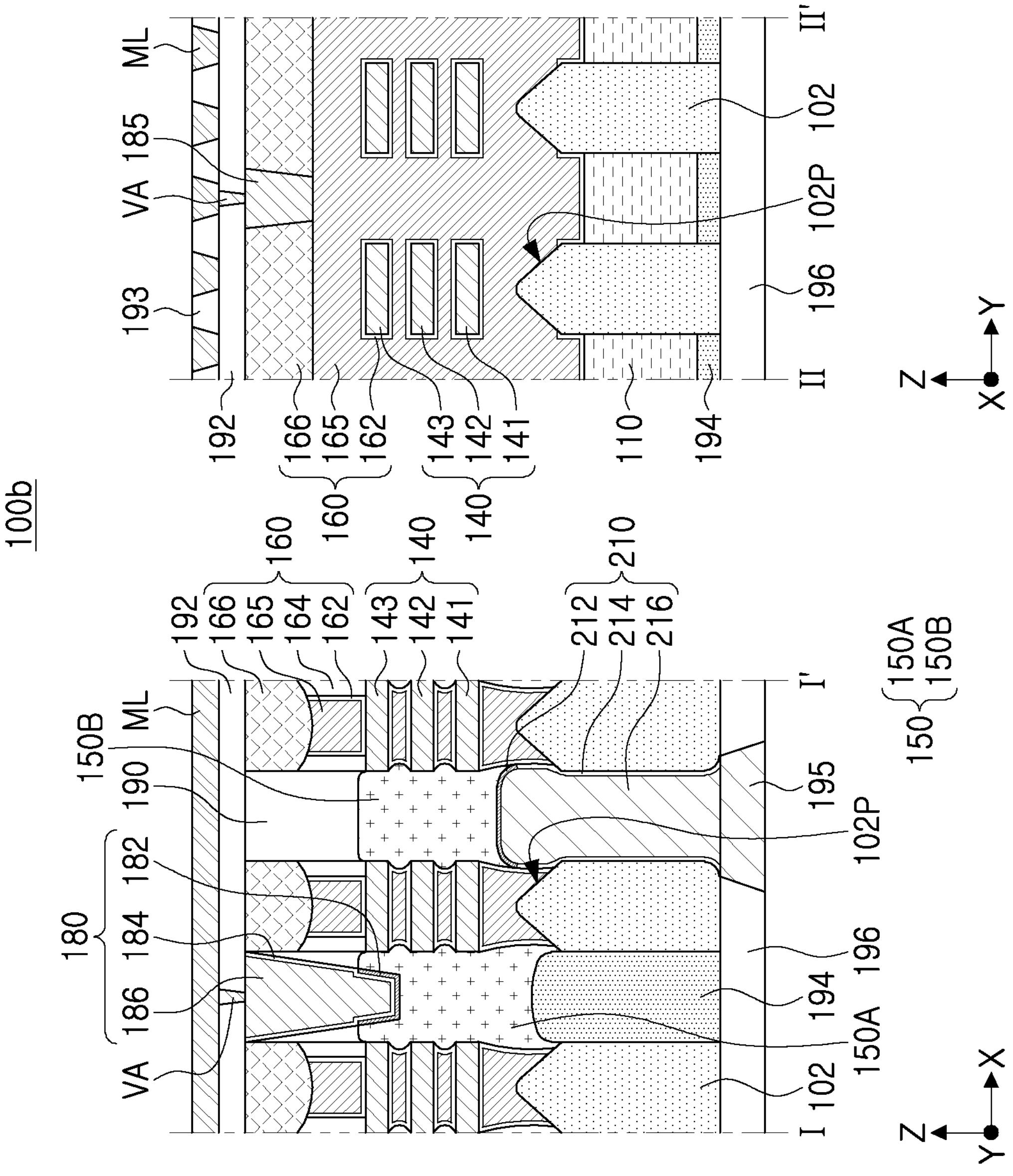
FIG. 4 shows schematic cross-sectional views illustrating a semiconductor device according to one or more example embodiments.

FIG. 4 shows schematic cross-sectional views illustrating a semiconductor device 100*b* according to one or more example embodiments. FIG. 4 illustrates regions corresponding to the cross-sections taken along line I-I' and II-II' of FIG. 2.

Referring to FIG. 4, in a semiconductor device 100*b*, a cross-section of protrusions 102P in the X-direction may have a triangular shape. A cross-section of the protrusions 102P in the Y-direction may have a triangular shape. The cross-section of the protrusions 102P in the X-direction and the cross-section of the protrusions 102P in the Y-direction are illustrated as having a triangular shape, but embodiments are not limited to this example configuration. The shapes of the cross-section of the protrusions 102P in the X-direction and the cross-section thereof in the Y-direction may be independent of each other.

Figure 5:
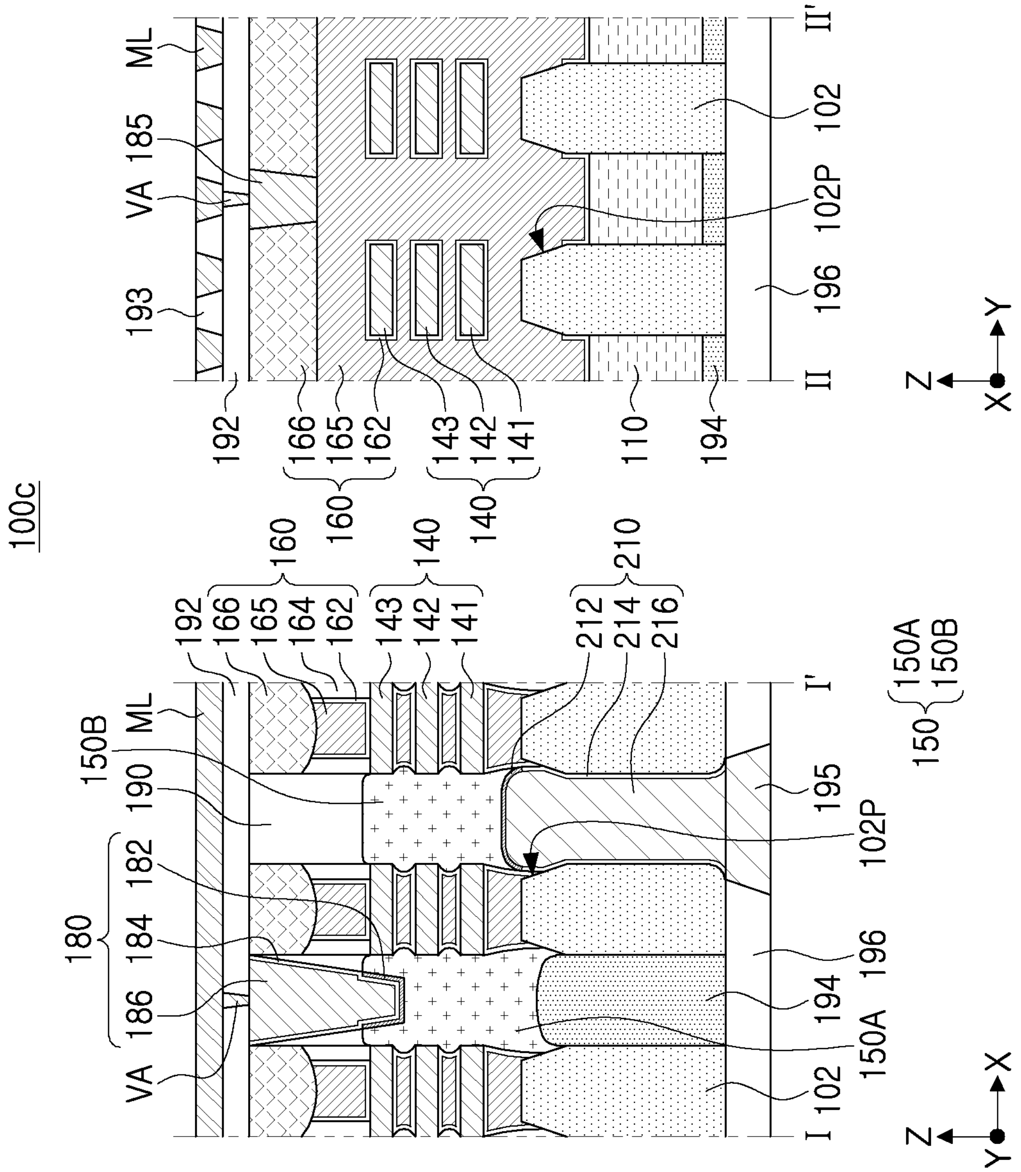
FIG. 5 shows schematic cross-sectional views illustrating a semiconductor device according to one or more example embodiments.

FIG. 5 shows schematic cross-sectional views illustrating a semiconductor device 100*c* according to one or more example embodiments. FIG. 5 illustrates regions corresponding to the cross-sections taken along lines I-I' and II-II' of FIG. 2.

Referring to FIG. 5, a semiconductor device 100*c*, a cross-section of protrusions 102P in the X-direction may have a trapezoidal shape. A cross-section of the protrusions 102P in the Y-direction may have a trapezoidal shape. The shapes of the cross-section of the protrusions 102P in the X-direction and the cross-section thereof in the Y-direction may be independent of each other. According to one or more example embodiments, a shape of a cross-section of the protrusions 102P in the X-direction may be at least one of a dome shape, a mushroom shape, a triangle shape, a quadrangle shape, and a shape of a cross-section of the protrusions 102P in the Y-direction may be different from that of a cross-section of the protrusions 102P in the X-direction.

Figure 6:
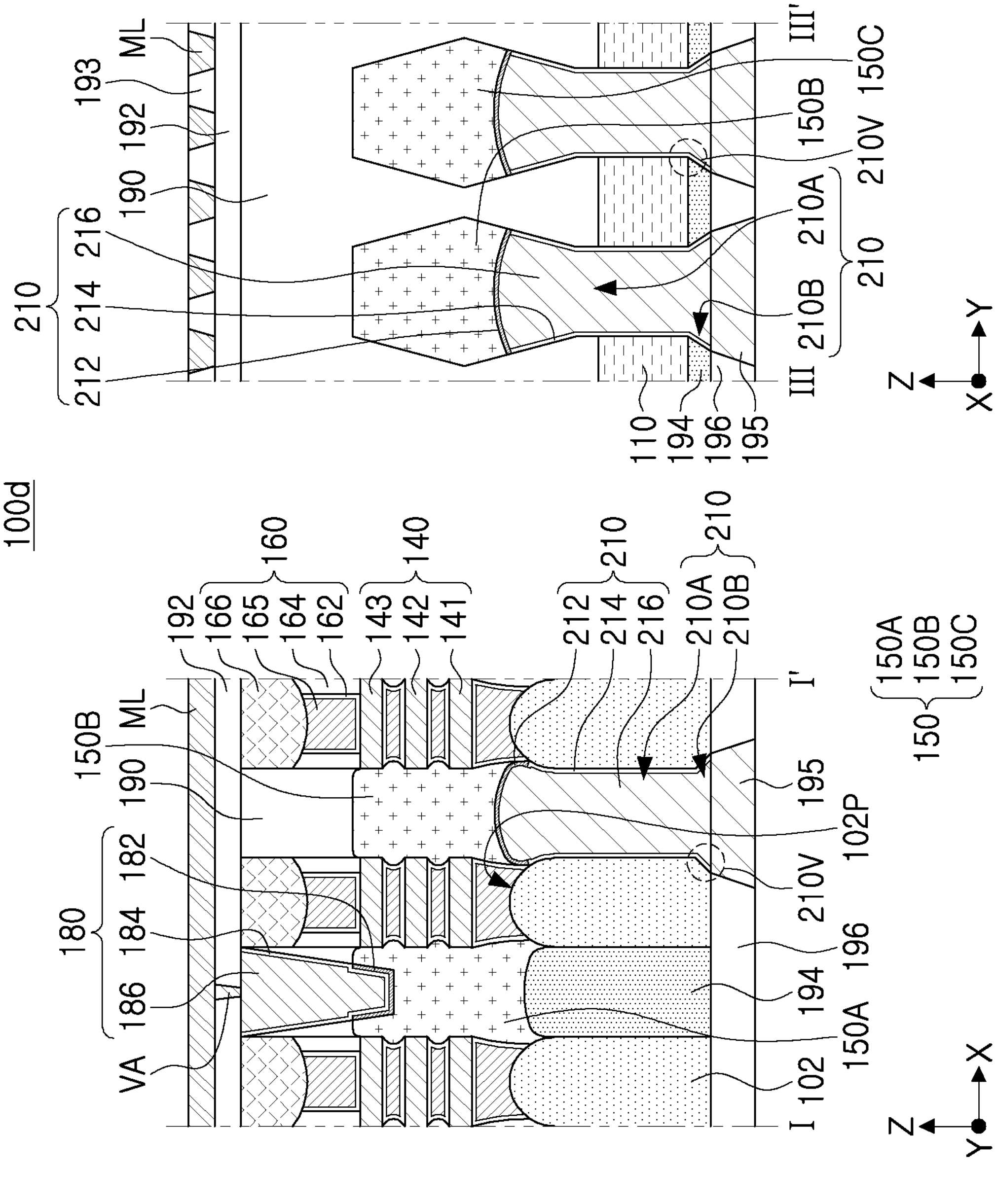
FIG. 6 shows schematic cross-sectional views illustrating a semiconductor device according to one or more example embodiments.

FIG. 6 shows schematic cross-sectional views illustrating a semiconductor device 100*d* according to one or more example embodiments. FIG. 6 illustrates regions corresponding to cross-sections taken along line I-I' and III-III' of FIG. 2.

Referring to FIG. 6, in a semiconductor device 100*d*, a side surface of a bend portion 210V may be inclined on a second portion 210B of backside contact structures 210. In FIG. 9L, in the process of providing a through-hole TH, a portion of a substrate insulating layer 194 on a device isolation layer 110 may be removed. In the process of removing a portion of the substrate insulating layer 194, a side surface of the substrate insulating layer 194 may be inclined.

Figure 7:
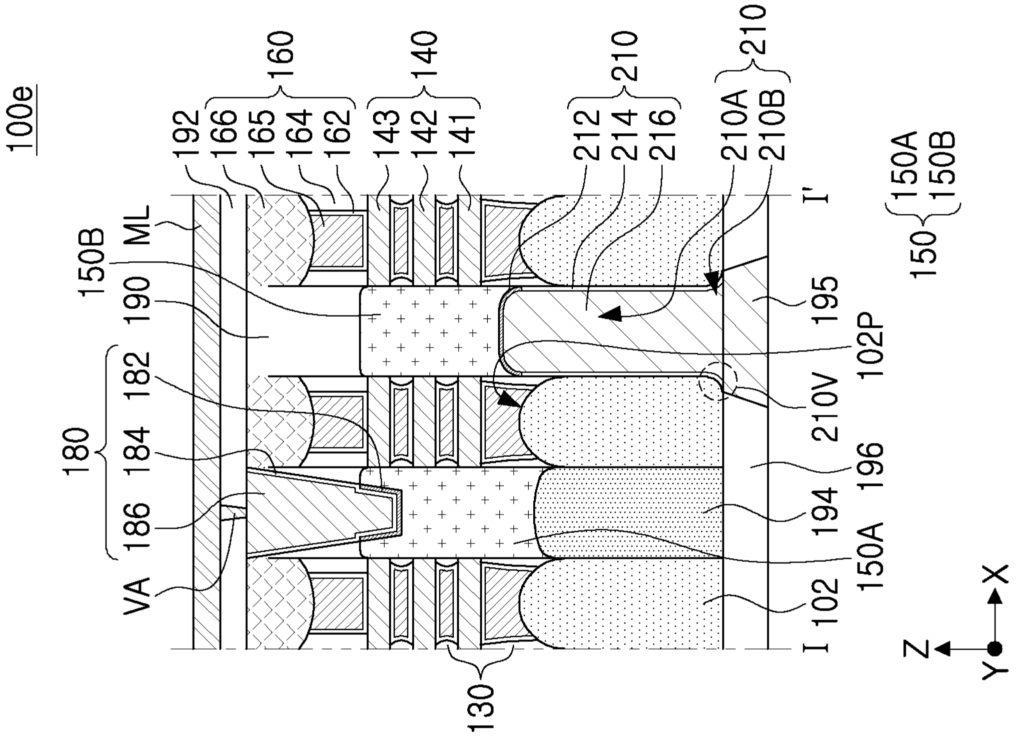
FIG. 7 is a schematic cross-sectional view illustrating a semiconductor device according to one or more example embodiments.

FIG. 7 is a schematic cross-sectional view illustrating a semiconductor device 100*e* according to one or more example embodiments. FIG. 7 illustrates a region corresponding to the cross-section taken along line I-I' of FIG. 2.

Referring to FIG. 7, a semiconductor device 100*e* may further include internal spacer layers 130 provided on both sides of a gate structure 160 in the first direction (i.e., the X-direction) on a lower surface of each of a plurality of channel layers 141, 142 and 143 in the one or more example embodiments of FIG. 2. The internal spacer layers 130 may be provided in parallel with a gate electrode 165 between the plurality of channel layers 141, 142 and 143. The internal spacer layers 130 may be in contact with a gate dielectric layer 162. The internal spacer layers 130 may be provided between the gate structure 160 and source/drain regions 150. Side surfaces of the internal spacer layers 130 may be in contact with the source/drain regions 150. In lower portions of each of the plurality of channel layers 141, 142 and 143, the gate electrode 165 may be spaced apart from, and electrically separated from, the source/drain regions 150 by the internal spacer layers 130. The internal spacer layers 130 may have a shape in which a side surface facing the gate electrode 165 is convexly rounded inwardly, toward the gate electrode 165. The internal spacer layers 130 may comprise an oxide, a nitride, and an oxynitride, and according to one or more example embodiments, may comprise a low dielectric constant film.

The internal spacer layers 130 may comprise the same material as that of the gate spacer layers 164, but embodiments are not limited to this example configuration. For example, the internal spacer layers 130 may include at least one of SiN, SiCN, SiOCN, SiBCN, and SiBN. The internal spacer layers 130 may also be applied to other example embodiments.

According to one or more example embodiments, side surfaces of the backside contact structures 210 may contact side surfaces of the insulating patterns 102. The internal spacer layers 130 may be provided between protrusions 102P and upper portions of each of the backside contact structures 210. For this reason, the backside contact structures 210 may be spaced apart from the gate electrode 165, and may prevent an occurrence of a leakage current and may secure a short margin. The protrusions 102P may be spaced apart from the upper portions of each of the backside contact structures 210 by the internal spacer layers 130.

Figure 8:
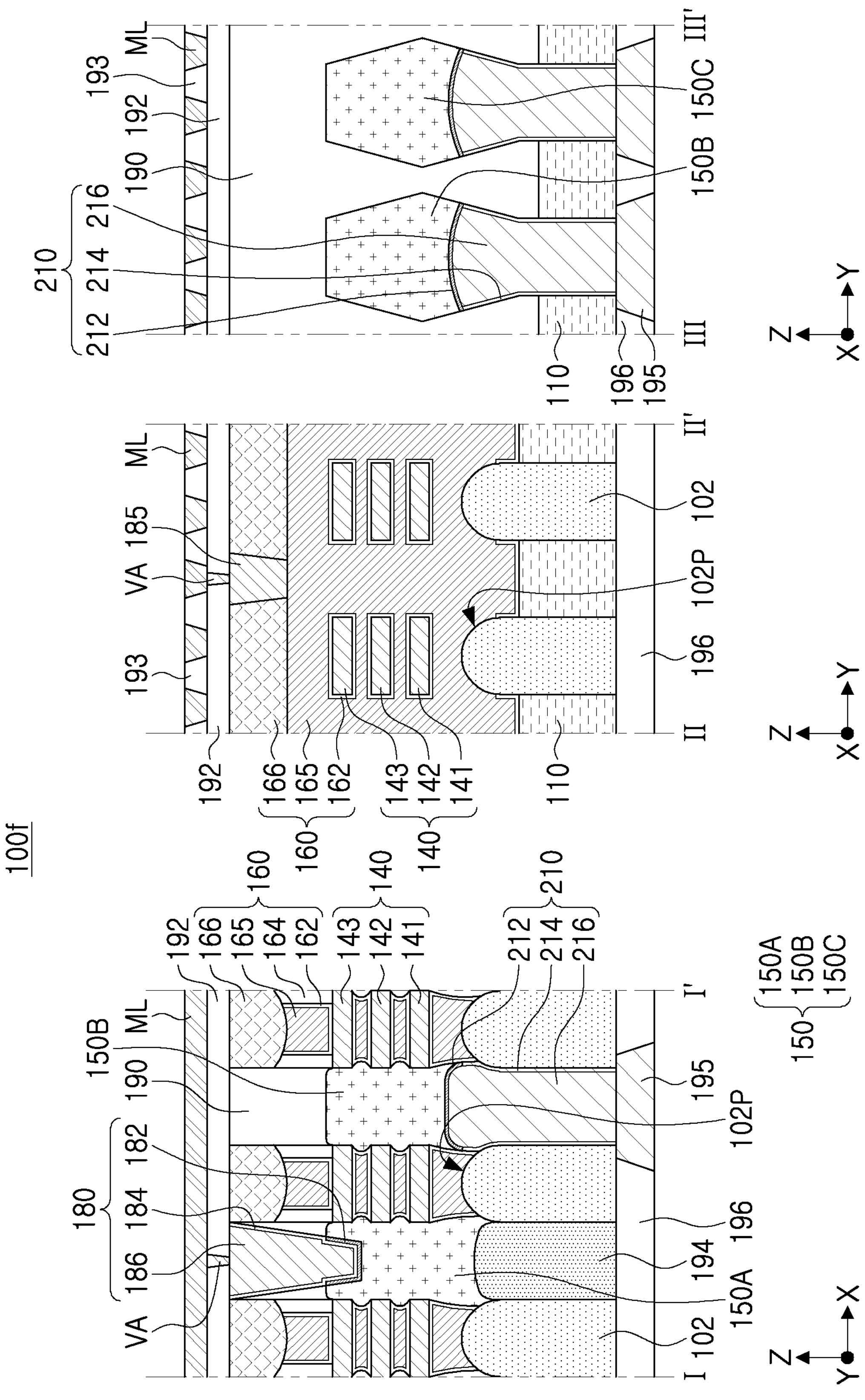
FIG. 8 shows schematic cross-sectional views illustrating a semiconductor device according to one or more example embodiments.

FIG. 8 shows schematic cross-sectional views illustrating a semiconductor device 100*f* according to one or more example embodiments. FIG. 8 illustrates areas corresponding to the cross-sections of FIG. 2.

Unlike the semiconductor device 100 of FIG. 2, in a semiconductor device 100*f*, a backside power structure 195 may be in contact with a lower surface of a device isolation layer 110. After a process of providing backside contact structures 210 in FIG. 9M, a substrate insulating layer 194 on a device isolation layer 110 may be removed by a planarization process. Accordingly, in FIG. 9M, an upper surface of the device isolation layer 110 may be exposed. In FIG. 9M, the upper surface of the device isolation layer 110, an upper surface of insulating patterns 102, and an upper surface of the backside contact structures 210 may be coplanar. Furthermore, a bend portion 210V (see FIG. 2) for connecting a first portion 210A (see FIG. 2) and a second portion 210B (see FIG. 2) of the backside contact structures 210 may be removed.

Next, after a lower insulating layer 196 is provided, a portion of the lower insulating layer 196 may be removed to form the backside power structure 195. The lower insulating layer 196 may cover the device isolation layer 110, the insulating patterns 102, the substrate insulating layer 194, and the backside contact structures 210.

FIGS. 9A, 9B, 9C, 9D, 9E, 9F, 9G, 9H, 9I, 9J, 9K, 9L and 9M are cross-sectional views illustrating a method of manufacturing a semiconductor device example according to one or more example embodiments according to a process order. FIGS. 9A, 9B, 9C, 9D, 9E, 9F, 9G, 9H, 9I, 9J, 9K, 9L and 9M illustrate cross-sections corresponding to FIG. 2.

Referring to FIG. 9A, sacrificial layers 120 and first, second and third channel layers 141, 142 and 143 may be alternately stacked on a substrate 101.

The substrate 101 may include silicon (Si), germanium (Ge), or silicon germanium (SiGe). The substrate 101 may include a bulk wafer, an epitaxial layer, a silicon on insulator (SOI) layer, or a semiconductor on insulator (SeOI) layer.

As illustrated in FIG. 2, the sacrificial layers 120 may be layers that are replaced with gate dielectric layers 162 and gate electrodes 165 below the third channel layer 143 through a subsequent process. A lowermost sacrificial layer 120 provided below the first channel layer 141 among the sacrificial layers 120 may be provided to be thicker than a thickness of other sacrificial layers 120. The lowermost sacrificial layer 120 may be thicker than a thickness of each of the first, second and third channel layers 141, 142 and 143. A loss of source/drain regions 150 may be reduced in a process of providing a subsequent backside contact structure 200 (see FIG. 9M) by thickly providing the lowermost sacrificial layer 120. A semiconductor device 100 having improved electrical properties may be provided by allowing the source/drain regions 150 to remain below a lower surface of the first channel layer 141. The sacrificial layers 120 may comprise a material having etching selectivity with respect to the first, second and third channel layers 141, 142 and 143, respectively. The first, second and third channel layers 141, 142 and 143 may include a material different from that of the sacrificial layers 120. The sacrificial layers 120 and the first, second and third channel layers 141, 142 and 143 may include a semiconductor material including at least one of silicon (Si), silicon germanium (SiGe), and germanium (Ge), but may include different materials, and may or may not include impurities. For example, the sacrificial layers 120 may include silicon germanium (SiGe), and the first, second and third channel layers 141, 142 and 143 may include silicon (Si).

The sacrificial layers 120 and the first, second and third channel layers 141, 142 and 143 may be provided by performing an epitaxial growth process on the stacked structure. The number of layers of channel layers alternately stacked with the sacrificial layers 120 may be variously changed in one or more example embodiments.

Figure 9B:
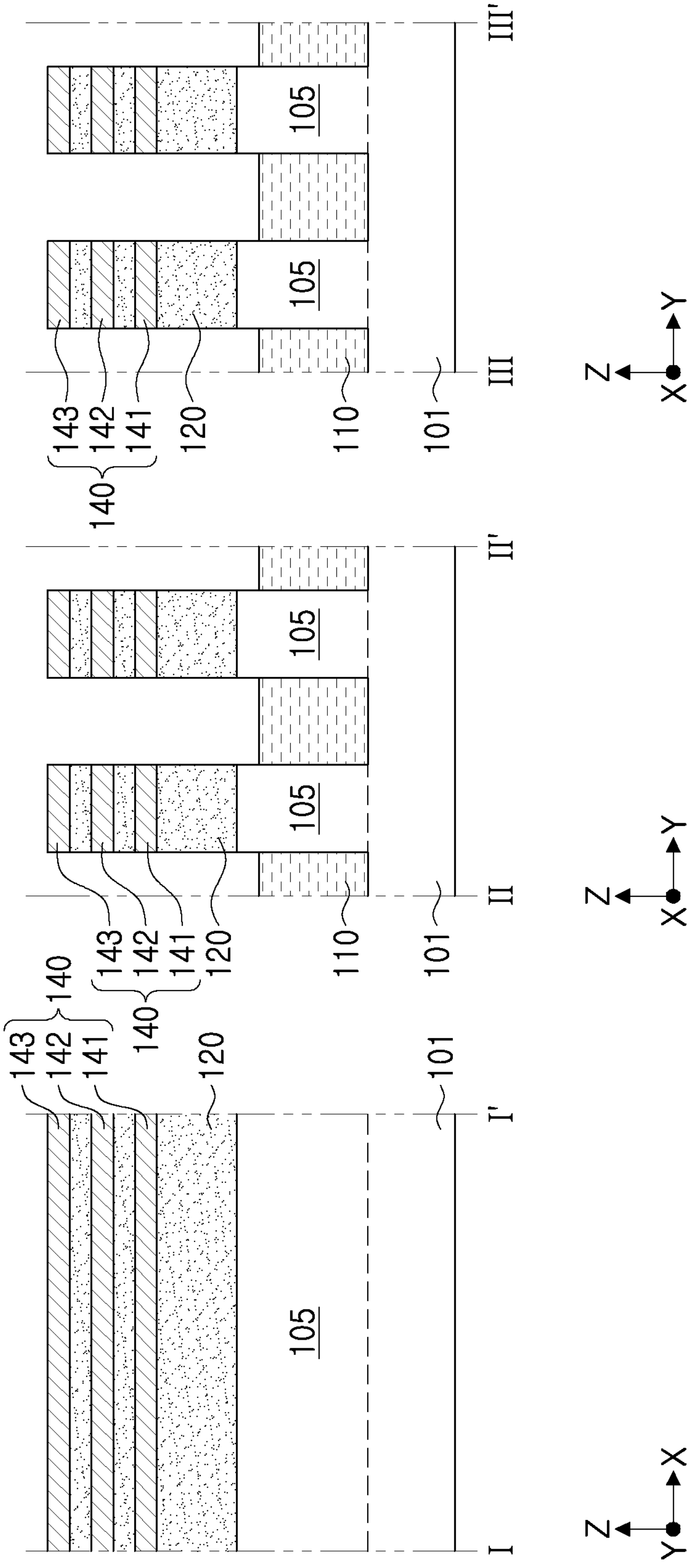

Referring to FIG. 9B, the sacrificial layers 120, the first, second and third channel layers 141, 142 and 143, and the substrate 101 may be partially removed to form an active structure including an active region 105, and a device isolation layer 110 may be provided.

The active structure may include the active region 105, the sacrificial layers 120, and the first, second and third channel layers 141, 142 and 143. The active structure may be provided in one direction, for example, in a line shape extending in the X-direction, and may be provided to be spaced apart from adjacent active structures in the Y-direction. Side surfaces of the active structure in the Y-direction may be coplanar with each other and may be provided in a straight line.

In a region in which some of the active region 105, the sacrificial layers 120, and the first, second and third channel layers 141, 142 and 143 are removed, the device isolation layer 110 may be provided by partially removing an insulating material so that the active region 105 protrudes, after burying the insulating material. An upper surface of the device isolation layer 110 may be provided lower than an upper surface of the active region 105.

The device isolation layer 110 may define the active region 105 in the substrate 101. The device isolation layer 110 may be provided by, for example, a shallow trench isolation (STI) process. According to one or more example embodiments, the device isolation layer 110 may further include a region having a step portion in a lower portion of the substrate 101 and extending deeper. The device isolation layer 110 may partially expose an upper portion of the active region 105. According to one or more example embodiments, the device isolation layer 110 may have a curved upper surface having a higher level as it approaches the active region 105.

Figure 9C:
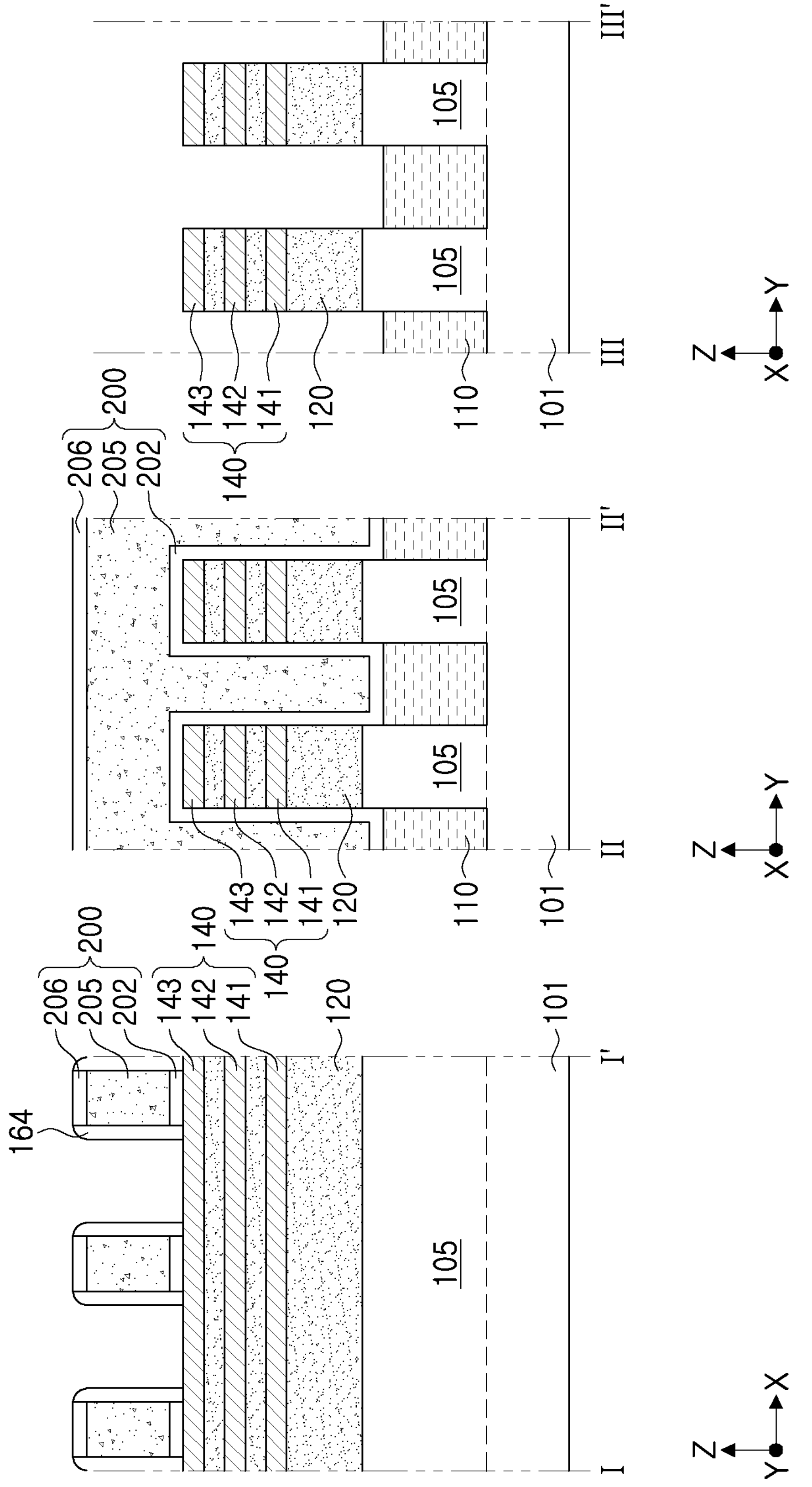

Referring to FIG. 9C, sacrificial gate structures 200 and gate spacer layers 164 may be provided on the active structure.

As illustrated in FIG. 2, the sacrificial gate structure 200 may be a sacrificial structure provided in a region in which the gate dielectric layer 162 and the gate electrode 165 are provided on the channel structures 140, through a subsequent process. The sacrificial gate structure 200 may have a linear shape crossing the active structure and extending in one direction. The sacrificial gate structures 200 may extend in the Y-direction, for example, and may be spaced apart from each other in the X-direction.

The sacrificial gate structure 200 may include first and second sacrificial gate layers 202 and 205 and a mask pattern layer 206 which are sequentially stacked on each other. The first and second sacrificial gate layers 202 and 205 may be patterned using the mask pattern layer 206. The first and second sacrificial gate layers 202 and 205 may comprise an insulating layer and a conductive layer, respectively, but embodiments are not limited to this example configuration, and the first and second sacrificial gate layers 202 and 205 may be provided as a single layer. For example, the first sacrificial gate layer 202 may include silicon oxide, and the second sacrificial gate layer 205 may include polysilicon. The mask pattern layer 206 may include silicon oxide and/or silicon nitride.

The gate spacer layers 164 may be provided on both sidewalls of the sacrificial gate structures 200. The gate spacer layers 164 may include a low dielectric constant material, and may include, for example, at least one of SiO, SiN, SiCN, SiOC, SiON, and SiOCN.

Figure 9D:
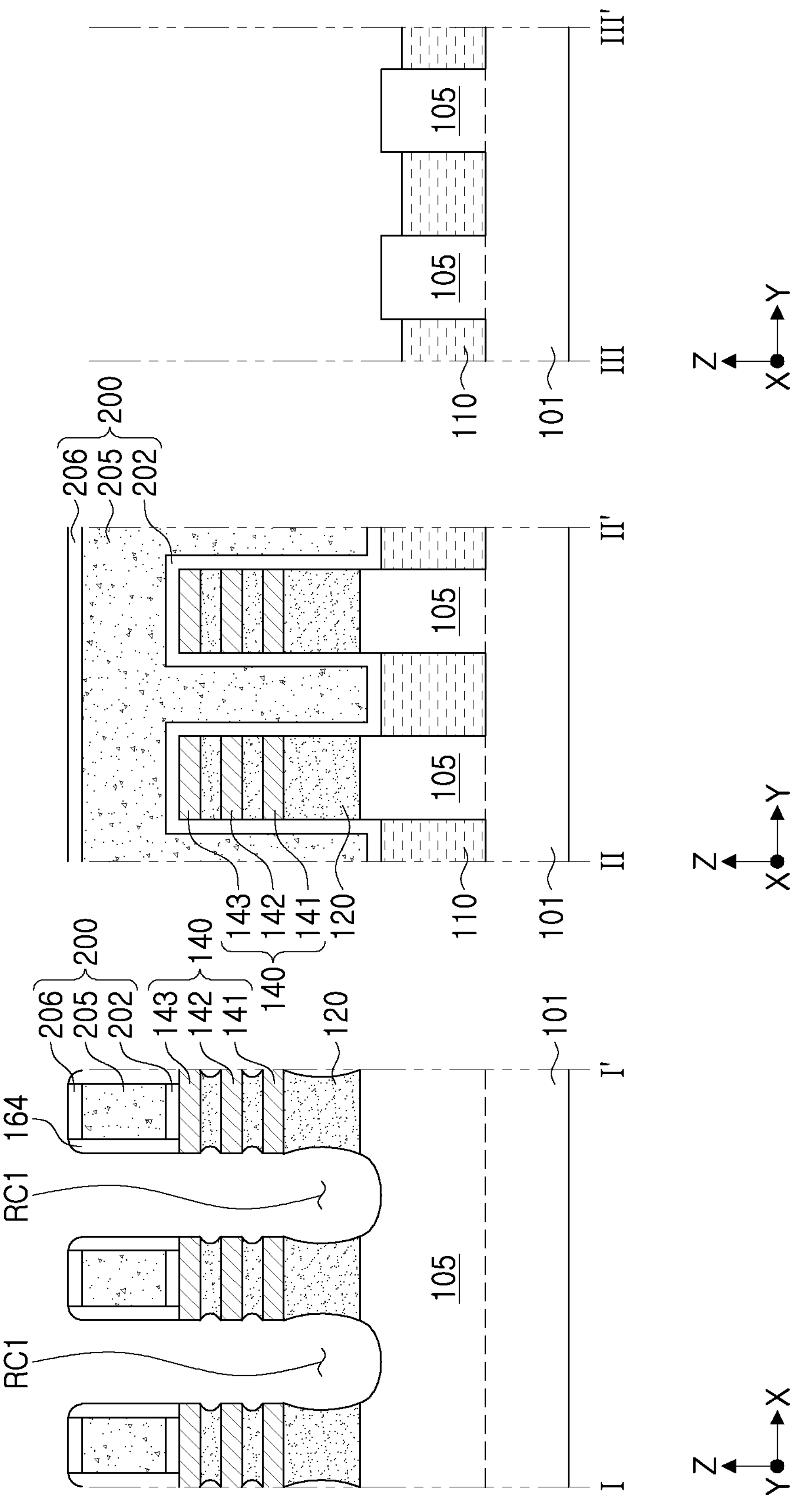

Referring to FIG. 9D, the sacrificial layers 120 and the first, second and third channel layers 141, 142 and 143 exposed from the sacrificial gate structures 200 may be partially removed to form first recess regions RC1, and some of the sacrificial layers 120 may be removed.

The first recess regions RC1 may be provided by removing a portion of the exposed sacrificial layers 120 and a portion of the exposed first, second and third channel layers 141, 142 and 143, using the sacrificial gate structures 200 and the gate spacer layers 164 as masks. Accordingly, the first, second and third channel layers 141, 142 and 143 may form channel structures 140 having a limited length in the X-direction.

The sacrificial layers 120 may be selectively etched against the channel structures 140 by, for example, a wet etching process and may be removed to a certain depth from a side surface thereof in the X-direction. The sacrificial layers 120 may have concave side surfaces inwardly by the etching of the side surface as described above. However, according to one or more example embodiments, a specific shape of the side surface of the sacrificial layers 120 is not limited to those illustrated in FIG. 9D.

According to one or more example embodiments, because a lowermost sacrificial layer 120 is provided to be thicker than other sacrificial layers 120, the first recess regions RC1 (see FIG. 9D) may recess an upper portion of the active region 105.

Figure 9E:
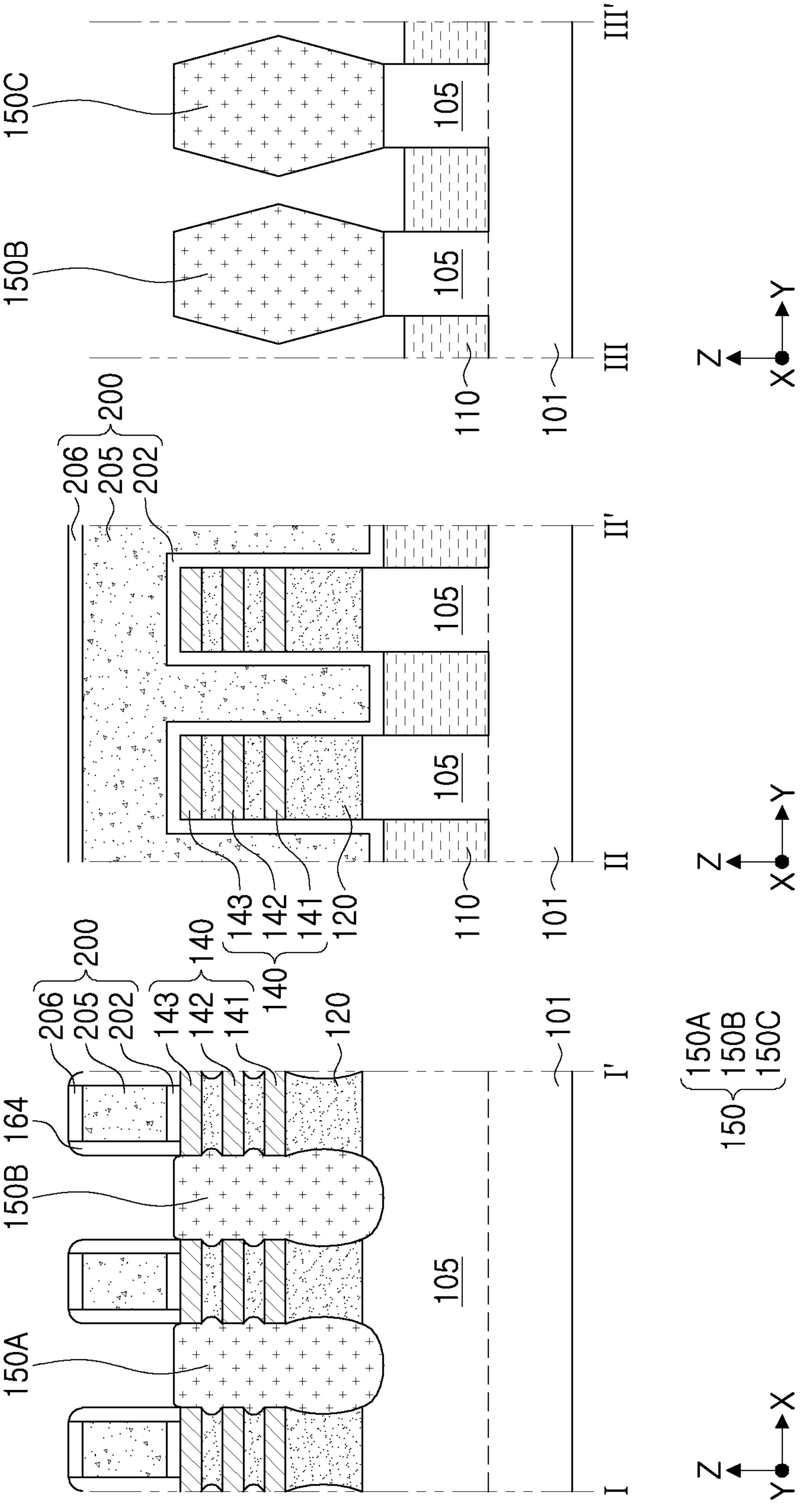

Referring to FIG. 9E, source/drain regions 150 may be provided by forming an epitaxial layer in the first recess regions RC1.

The source/drain regions 150 may be provided by an appropriate epitaxial growth process. The source/drain regions 150 may be provided by epitaxial growth and may extend to come into contact with the plurality of channel layers 141, 142 and 143 and the sacrificial layers 120 within the first recess region RC1. A surface on which the source/drain regions 150 come into contact with the plurality of channel layers 141, 142 and 143 and the sacrificial layers 120 may have a wavy shape. The source/drain regions 150 may include impurities by in-situ doping. Because the source/drain regions 150 may be provided on a lower level than a level of a lower surface of the first channel layer 141, second and third source/drain regions 150B and 150C may remain on a lower level than that of the lower surface of the first channel layer 141 in a process of forming subsequent backside contact structures 210.

Figure 9F:
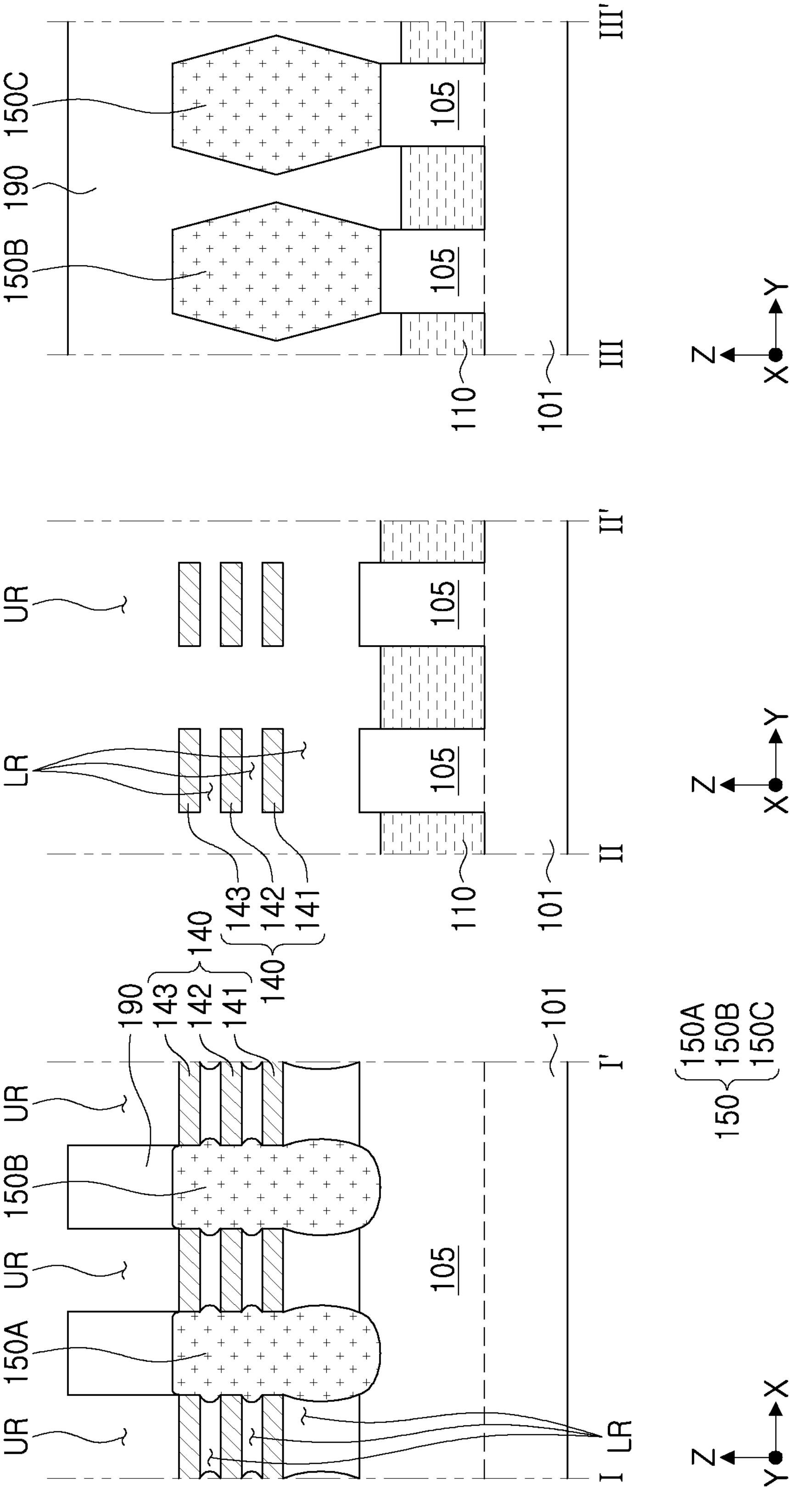

Referring to FIG. 9F, an interlayer insulating layer 190 covering the source/drain regions 150 may be provided, and the sacrificial gate structures 200 and the sacrificial layers 120 may be removed.

The interlayer insulating layer 190 may be provided by forming an insulating film covering the sacrificial gate structures 200 and the source/drain regions 150 and by performing a planarization process.

The sacrificial gate structures 200 and the sacrificial layers 120 may be selectively removed with respect to the gate spacer layers 164, the interlayer insulating layer 190, and the channel structures 140. First, the sacrificial gate structures 200 may be removed to form upper gap regions UR, and then the sacrificial layers 120 exposed through the upper gap regions UR may be removed to form lower gap regions LR.

For example, when the sacrificial layers 120 include silicon germanium (SiGe) and the channel structures 140 include silicon (Si), the sacrificial layers 120 may be selectively removed with respect to the channel structures 140 by performing a wet etching process.

Figure 9G:
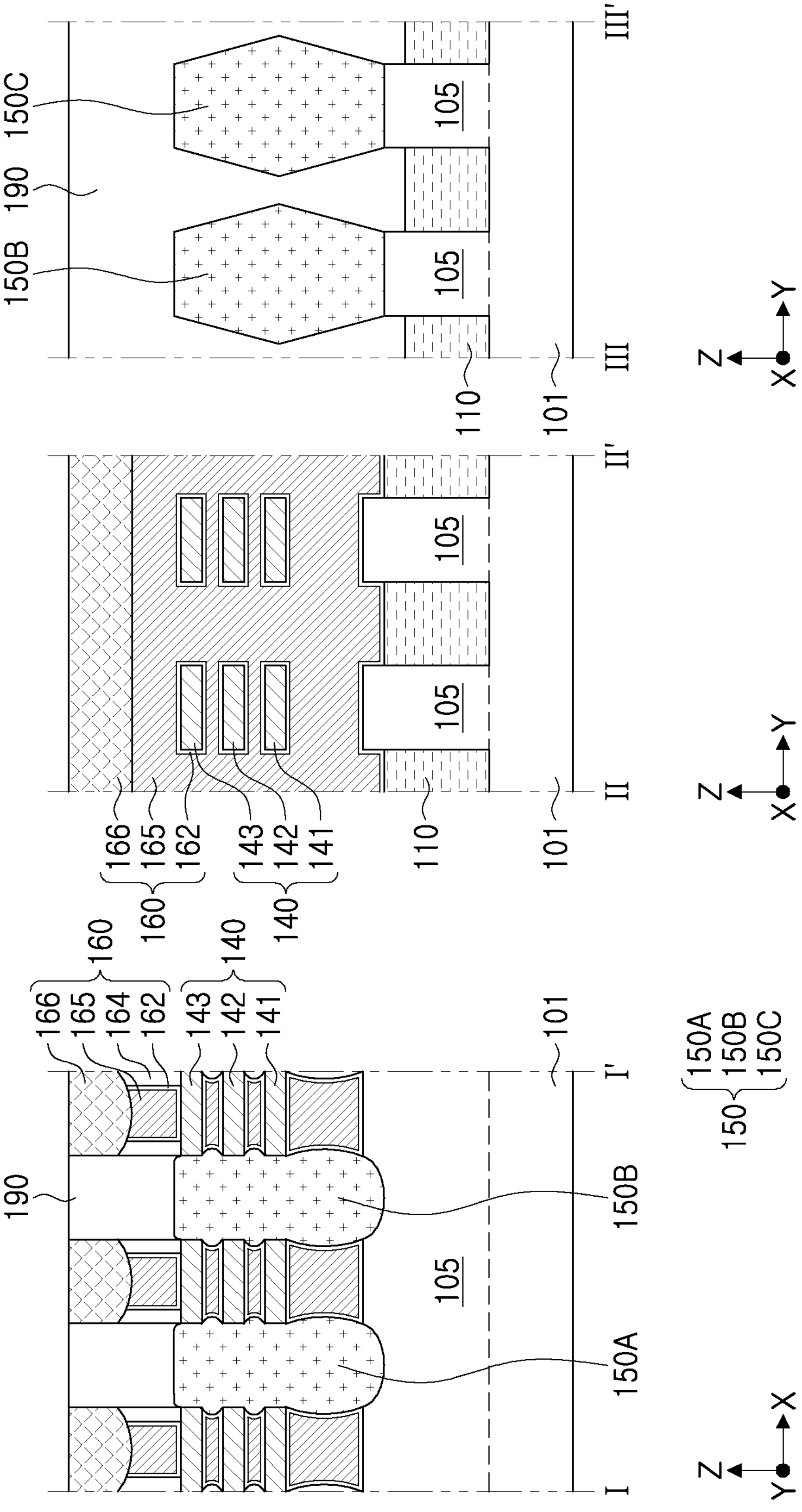

Referring to FIG. 9G, a gate structure 160 may be provided in the upper gap regions UR and the lower gap regions LR.

The gate dielectric layers 162 may be provided to conformally cover internal surfaces of the upper gap regions UR and the lower gap regions LR. The gate electrode 165 may be provided to bury the upper gap regions UR and the lower gap regions LR. The gate electrode 165 and the gate spacer layers 164 may be removed from the upper gap regions UR by a predetermined depth. A gate capping layer 166 may be provided in a region in which the gate electrode 165 and the gate spacer layers 164 are removed from the upper gap regions UR. Accordingly, the gate structure 160 including the gate dielectric layers 162, the gate electrode 165, the gate spacer layers 164, and the gate capping layer 166 may be provided.

Figure 9H:
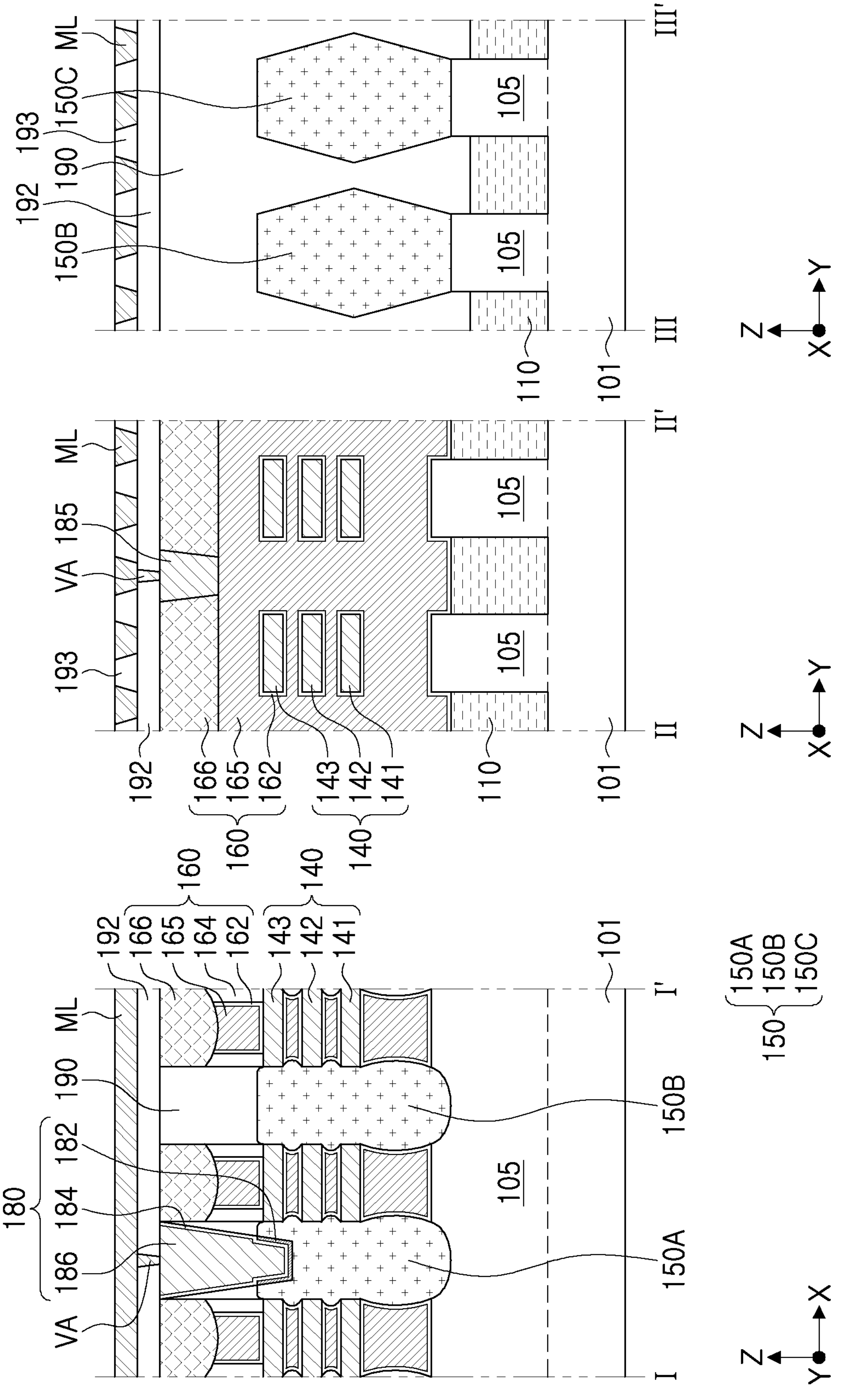

Referring to FIG. 9H, a first contact structure 180, a gate contact structure 185, first and second upper insulating layers 192 and 193, a via VA, and a metal wiring ML may be provided.

A contact hole connected to the source/drain regions 150 may be provided in the interlayer insulating layer 190, and a barrier layer 184 and a plug conductive layer 186 may be sequentially provided to charge the contact hole. Specifically, after depositing a material providing the barrier layer 184 in the contact holes, a silicide process may be performed to provide, at a lower end of the contact hole, a first metal-semiconductor compound layer 182, such as a silicide layer. Next, an upper surface of the contact structure 180 and an upper surface of the interlayer insulating layer 190 may form a substantially flat coplanar surface by performing a planarization process such as chemical mechanical polishing (CMP).

Next, a gate contact structure 185 connected to the gate electrode 165 by penetrating through the gate capping layer 166 may be provided.

The first upper insulating layer 192 may be provided to cover the first contact structure 180 and the gate contact structure 185, and the via VA may be provided by penetrating through the first upper insulating layer 192 so that the via VA is connected to the first contact structure 180 and the gate contact structure 185. The second upper insulating layer 193 may be provided to cover the first upper insulating layer 192 and the via VA, and the second upper insulating layer 193 may be patterned and filled with a conductive material, thus providing a metal wiring ML. The metal wiring ML is not limited to the above-described process, and may be provided by a subtractive process.

Figure 9I:
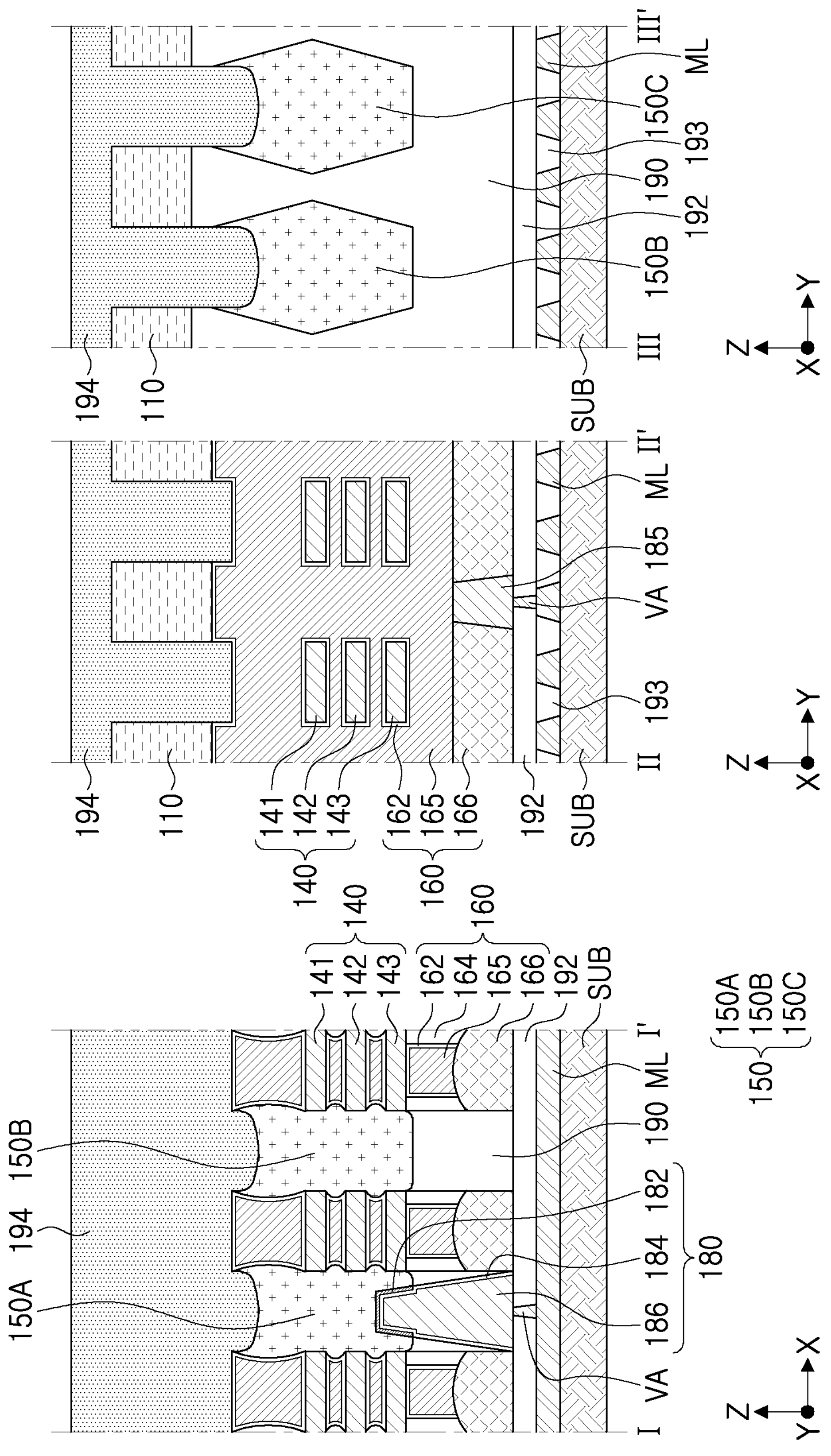

Referring to FIG. 9I, the entire structure provided with reference to FIGS. 9A, 9B, 9C, 9D, 9E, 9F, 9G and 9H may be attached to a carrier substrate SUB, the substrate 101 may be removed, and a substrate insulating layer 194 may be provided.

The carrier substrate SUB may be attached to the second upper insulating layer 193 or the metal wiring ML in order to perform a process on a lower surface of the substrate 101 in FIG. 9H. In the drawings, for better understanding, it is illustrated that the entire structure is rotated or inverted in a form in which the entire structure has a mirror image of the structure illustrated in FIG. 9H.

The substrate 101 may be removed from an upper surface of the substrate 101. For example, the substrate 101 may be removed by a wrapping process, a grinding process, or a polishing process, and may be thinned, and the remaining region thereof may also be removed by an etching process and/or an oxidation process. According to one or more example embodiments, because the source/drain regions 150 may include the same material as that of the substrate 101, some of the source/drain regions 150 may be removed in a process of removing the substrate 101. The substrate insulating layer 194 may be provided in a region from which the substrate 101 is removed.

Figure 9J:
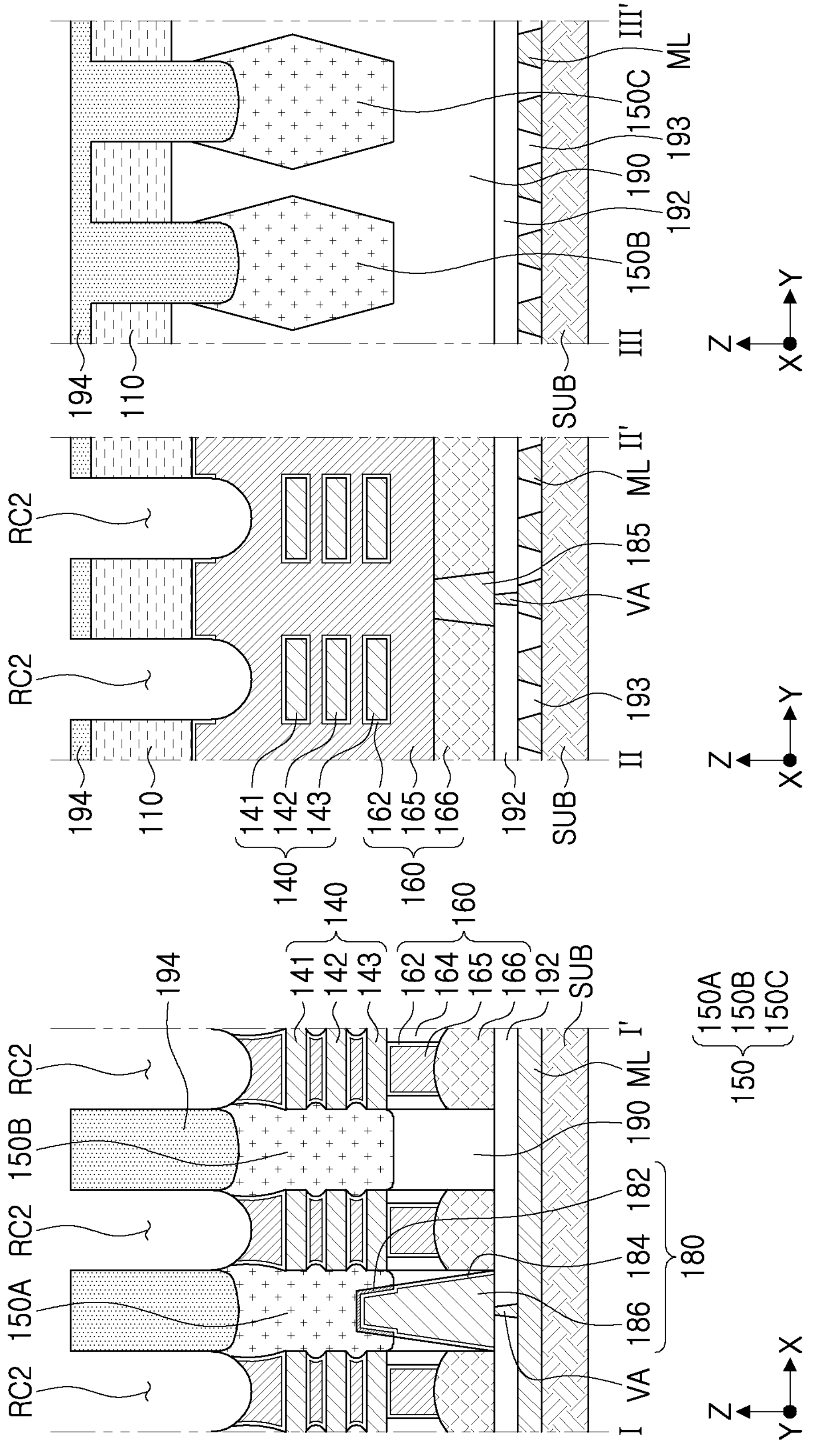

Referring to FIG. 9J, a portion of the substrate insulating layer 194 and a portion of a lower portion of the gate structure 160 may be removed to form second recess regions RC2.

First, a mask layer may be provided to cover an upper surface of the substrate insulating layer 194, except for a region in which a plurality of channel layers 141, 142 and 143 and a gate structure 160 vertically overlap each other. For example, an upper surface of the substrate insulating layer 194 may be exposed in the region in which the plurality of channel layers 141, 142 and 143 vertically overlap the gate structure 160. The mask layer and the exposed substrate insulating layer 194 may be partially removed using an etching process. In the process of partially removing the substrate insulating layer 194, an upper portion of the gate structure 160 may be exposed, and the second recess regions RC2 may be provided by a level lower than a level of a surface on which the substrate insulating layer 194 contacts the source/drain regions 150. Accordingly, the upper surface of the gate electrode 165 may be exposed. By partially removing the gate electrode 165, a backside contact structures 210, further described below, may secure a short margin with the gate electrode 165. According to one or more example embodiments, the upper portion of the gate structure 160 may have various shapes, and in the drawings, the upper portion of the gate structure 160 is illustrated as having a downwardly convex shape, but embodiments are not limited this example configuration.

Figure 9K:
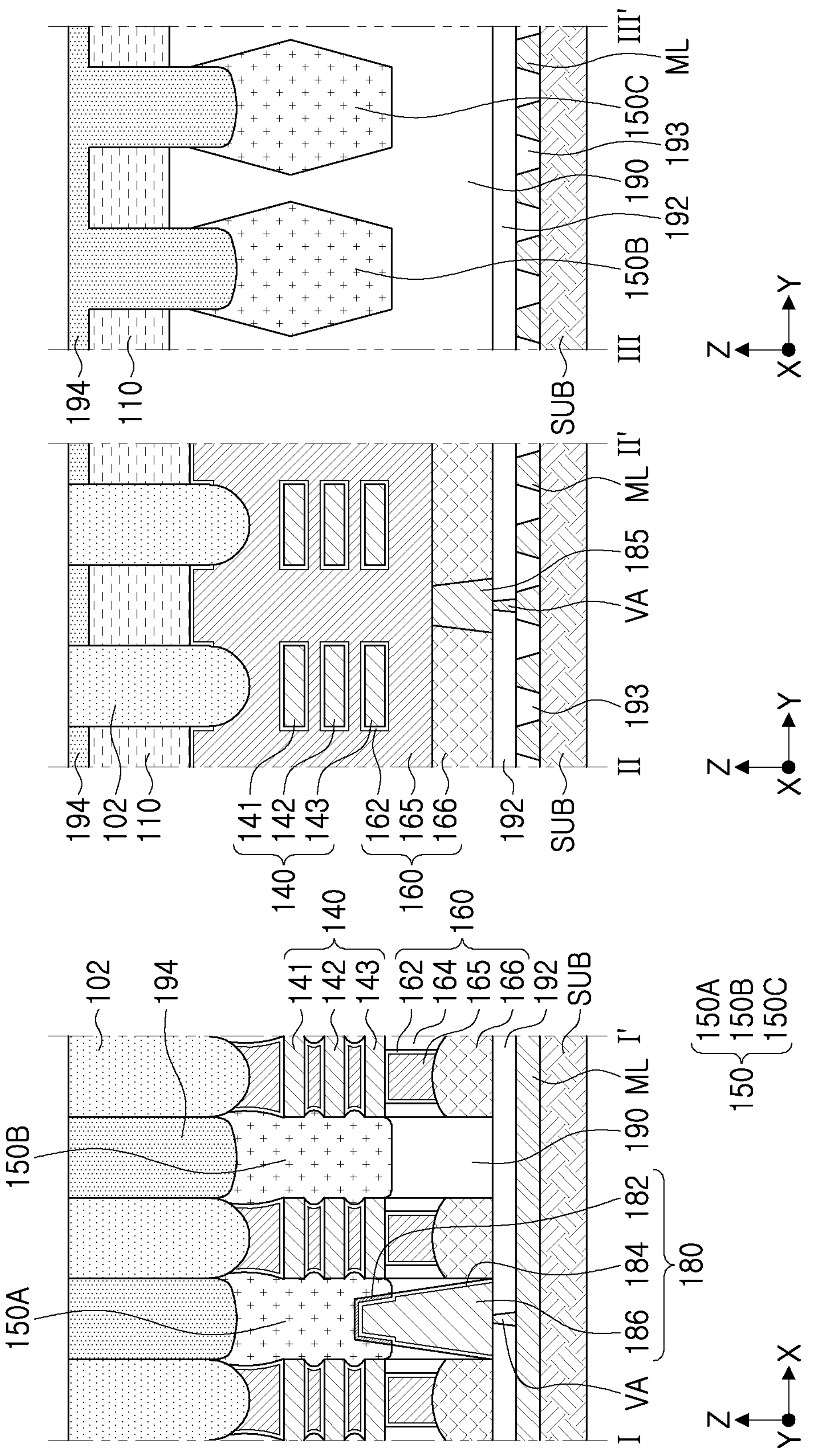
Figure 9L:
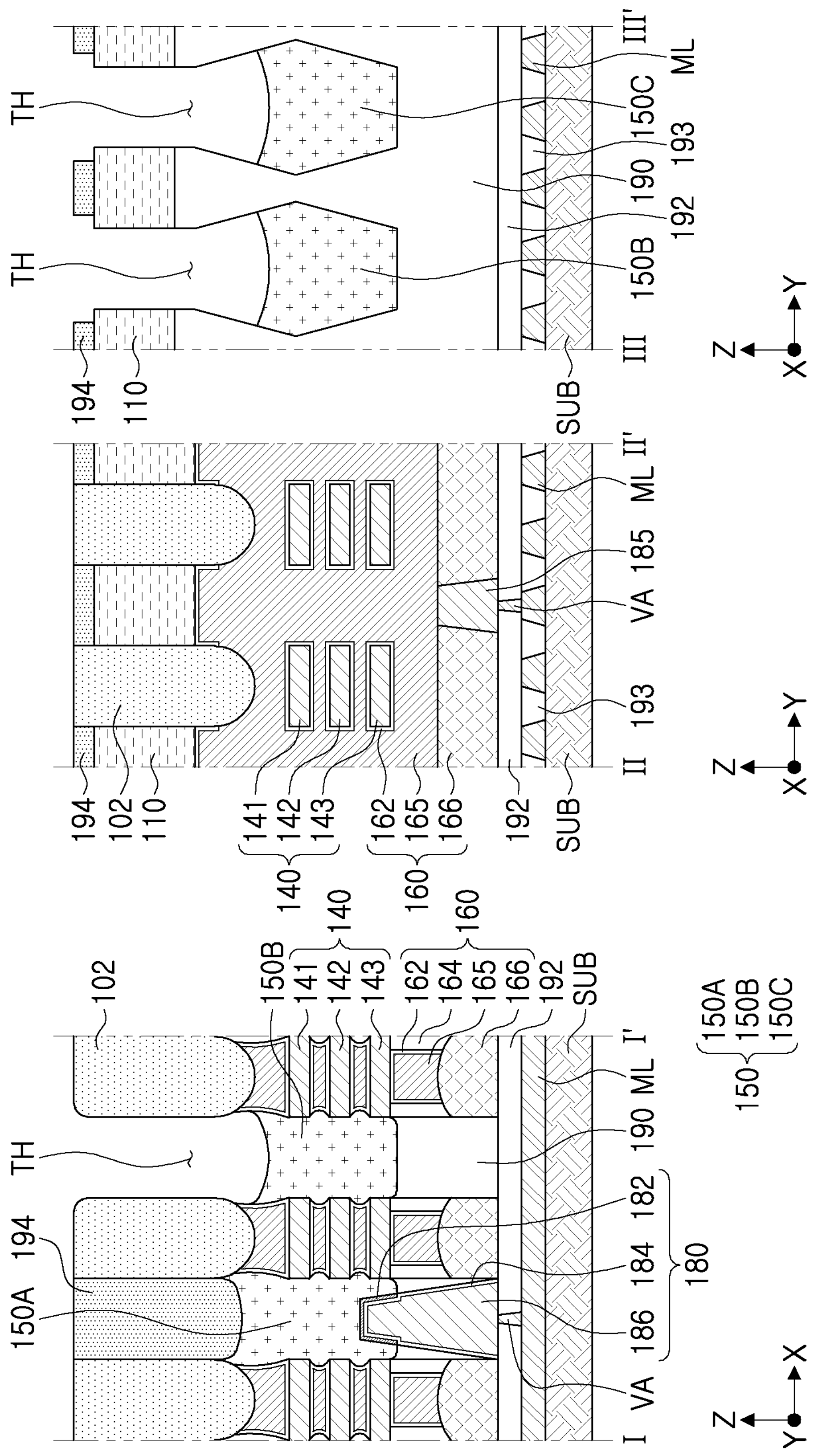
Figure 9M:
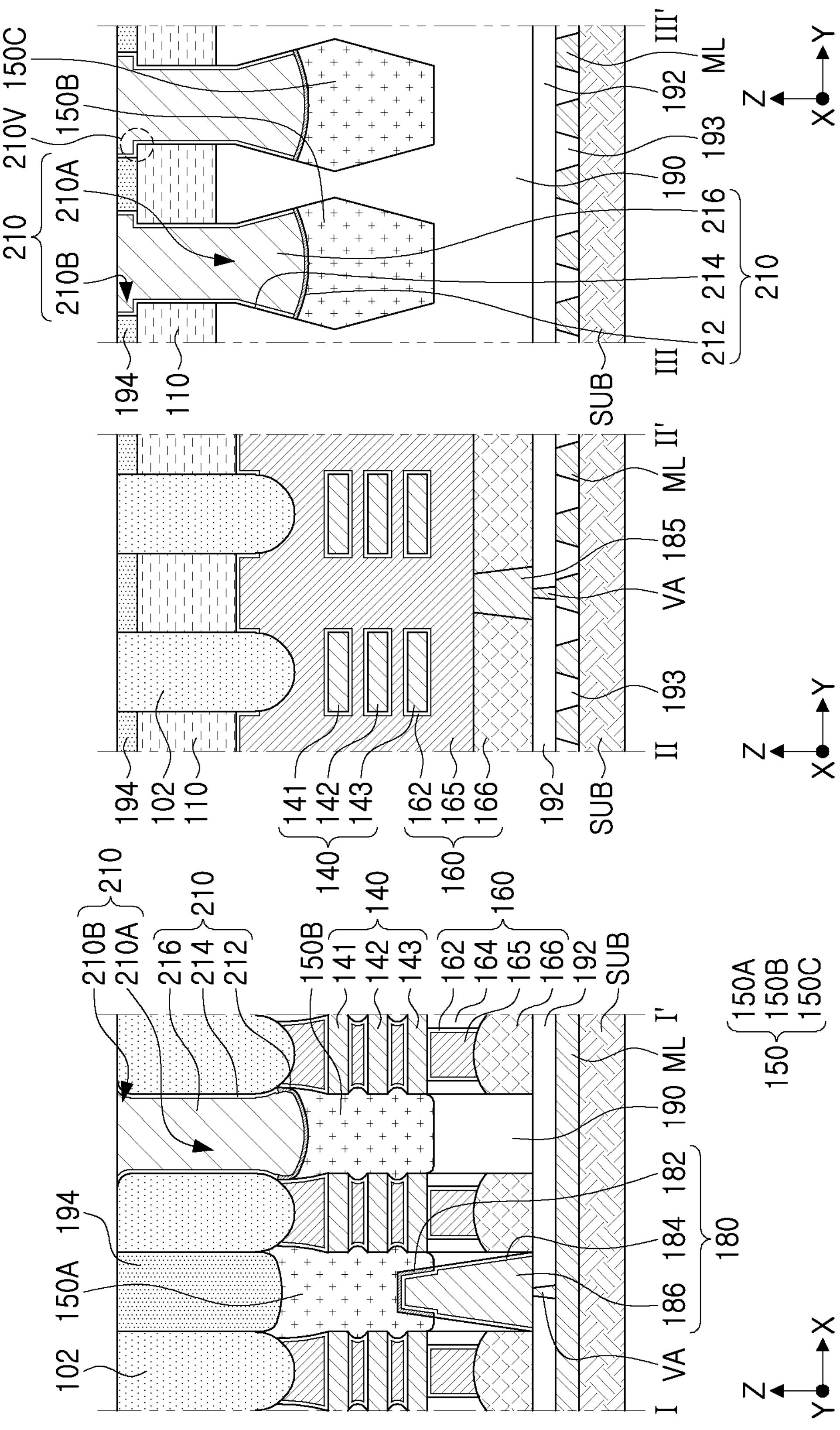

Referring to FIG. 9K, insulating patterns 102 may be provided in the second recess regions RC2.

The insulating patterns 102 may be spaced apart from each other in the X-direction by the substrate insulating layer 194. The insulating patterns 102 may be spaced apart from each other in the Y-direction by the device isolation layer 110. The insulating patterns 102 may be provided on a side surface of the substrate insulating layer 194 and may be provided on a side surface of the device isolation layer 110.

Referring to FIG. 9L, a through-hole TH may be provided.

A mask layer may cover upper surfaces of a substrate insulating layer 194 and insulating patterns 102, but may be provided to expose an upper portion of a region corresponding to the backside contact structures 210 (see FIG. 9M). The substrate insulating layer 194 vertically overlapping a second source/drain region 150B and a third source/drain region 150C may be removed, except for the substrate insulating layer 194 provided on a first source/drain region 150A connected to a first contact structure 180. The substrate insulating layer 194 may be selectively removed with respect to the insulating patterns 102. Accordingly, a through-hole TH may be provided in a region corresponding to the second contact structures 210 (see FIG. 9M). According to a method of removing the substrate insulating layer 194, the second contact structures 210 may have bend portions 210V. The through-hole VH may be provided by a level lower than that of a lower end of the insulating patterns 102. The through-hole VH may be provided by removing the substrate insulating layer 194 below the source/drain regions 150. In the process of providing the through-hole VH, an upper portion of the source/drain regions 150 may be partially removed. In FIG. 9A, because a lowermost sacrificial layer 120 is provided thick, a level of a lowermost end of the through-hole VH may be higher than a level of an upper surface of the first channel layer 141. A contact margin may be secured between second contact structures 210 described below and the second source/drain region 150B.

Referring to FIG. 9M, second contact structures 210 may be provided to fill the through-hole TH.

A second metal-semiconductor compound layer 212 may be provided by performing a metal-semiconductor process such as a silicide process, using the source/drain regions 150 exposed by the through-hole TH. A second contact structure 210 may be provided by providing a conductive layer 216 on a side surface of the through-hole TH to fill a liner layer 214 and an interior of the through-hole TH. Next, referring to FIG. 2, a backside power structure 195 may be provided.

After providing a lower insulating layer 196, a portion of the lower insulating layer 196 may be removed to form the backside power structure 195, and the carrier substrate SUB may be removed. Accordingly, the semiconductor device 100 of FIGS. 1 and 2 may be manufactured. The semiconductor device 100 may be packaged in a state in which the backside power structure 195 is provided in an upper portion thereof, but embodiments are not limited this example configuration.

The present disclosure is not limited to the above-described embodiments and the accompanying drawings but is defined by the appended claims. While example embodiments have been particularly shown and described above, it will be apparent to those skilled in the art that various replacements, modifications, or changes in form and details may be made therein without departing from the spirit and scope of the following claims.

What is claimed is:

1. A semiconductor device comprising:

insulating patterns spaced apart from each other in a first direction and in a second direction that intersects the first direction;

a substrate insulating layer on first side surfaces of the insulating patterns;

a device isolation layer on second side surfaces of the insulating patterns;

channel layers on the insulating patterns and spaced apart from each other in a vertical direction that is perpendicular to an upper surface of the device isolation layer;

gate structures vertically overlapping the insulating patterns, surrounding each of the channel layers, and extending in the second direction;

source/drain regions provided outside the gate structures; and backside contact structures electrically connected to the source/drain regions and provided below the source/drain regions, wherein the insulating patterns comprise protrusions protruding in the vertical direction from the upper surface of the device isolation layer, and wherein, in a region in which the insulating patterns vertically overlap the gate structures, a vertical distance between a lower surface of a lowermost channel layer among the channel layers and an upper surface of the protrusions is greater than a vertical distance between the channel layers.

2. The semiconductor device of claim 1, wherein a level of an uppermost end of each of the backside contact structures is lower than a level of the lower surface of the lowermost channel layer.

3. The semiconductor device of claim 1, wherein a level of an uppermost end of each of the backside contact structures is higher than a level of an uppermost end of each of the protrusions.

4. The semiconductor device of claim 1, wherein the substrate insulating layer contacts the source/drain regions, and wherein a level of a surface on which the substrate insulating layer contacts the source/drain regions is lower than a level of an uppermost end of each of the protrusions.

5. The semiconductor device of claim 1, wherein the source/drain regions contact the substrate insulating layer and the insulating patterns.

6. The semiconductor device of claim 1, wherein a cross-section of each of the protrusions in at least one of the first direction and the second direction has at least one of a dome shape, a mushroom shape, a triangle shape, a square shape, and a trapezoid shape.

7. The semiconductor device of claim 1, wherein each of the gate structures comprises a gate dielectric layer and a gate electrode, and wherein, in a region in which the gate structures vertically overlap the channel layers, a vertical distance between the lower surface of the lowermost channel layer and the upper surface of the device isolation layer is greater than a vertical distance between an uppermost surface of the gate electrode and an upper surface of an uppermost channel layer among the channel layers.

8. The semiconductor device of claim 7, wherein the backside contact structures contact the gate dielectric layer and are spaced apart from the gate electrode by the gate dielectric layer.

9. The semiconductor device of claim 1, further comprising:

internal spacer layers provided between the gate structures and the source/drain regions in the first direction.

10. The semiconductor device of claim 9, wherein side surfaces of the backside contact structures contact side surfaces of the insulating patterns, wherein the internal spacer layers are provided between the protrusions and upper portions of each of the backside contact structures, and wherein the protrusions are spaced apart from the upper portions of each of the backside contact structures by the internal spacer layers.

11. The semiconductor device of claim 1, wherein each of the backside contact structures comprise:

a first portion at a level higher than a level of a lower surface of the device isolation layer;

a second portion at a level lower than the level of the lower surface of the device isolation layer; and a bend portion connecting the first portion and the second portion, and wherein a width of the second portion is greater than a width of the first portion.

12. The semiconductor device of claim 11, wherein the substrate insulating layer covers the lower surface of the device isolation layer and a side surface of the second portion.

13. The semiconductor device of claim 11, wherein the bend portion comprises a side surface inclined on the second portion.

14. The semiconductor device of claim 1, further comprising:

a backside power structure below the backside contact structures, connected to the backside contact structures, and configured to apply power to the source/drain regions.

15. The semiconductor device of claim 14, wherein the backside power structure contacts a lower surface of the device isolation layer.

16. A semiconductor device comprising:

insulating patterns spaced apart from each other in a first direction and in a second direction that intersects the first direction;

a substrate insulating layer on first side surfaces of the insulating patterns;

a device isolation layer on second side surface of the insulating patterns;

a channel layers on the insulating patterns and spaced apart from each other in a vertical direction that is perpendicular to an upper surface of the device isolation layer;

gate structures vertically overlapping the insulating patterns, surrounding each of the channel layers, and extending in the second direction;

source/drain regions provided outside the gate structures; and contact structures connected to the source/drain regions, wherein the source/drain regions comprise:

a first source/drain region on the substrate insulating layer and vertically overlapping the substrate insulating layer; and a second source/drain region spaced apart from the first source/drain region in the first direction, wherein the contact structures comprise:

a first contact structure above the first source/drain region and connected to the first source/drain region; and a second contact structure connected to the second source/drain region and penetrating through the insulating patterns below the second source/drain region, and wherein the insulating patterns partially penetrate through lower portions of the gate structures.

17. The semiconductor device of claim 16, wherein the insulating patterns are spaced apart from the channel layers below the channel layers, and wherein a vertical distance between an upper surface of the insulating patterns and a lower surface of a lowermost channel layer among the channel layers is greater than a vertical distance between the channel layers.

18. The semiconductor device of claim 16, wherein the second contact structure does not vertically overlap the first contact structure.

19. The semiconductor device of claim 16, wherein a level of an uppermost end of the second contact structure is higher than a level of an uppermost end of the insulating patterns and lower than a level of a lower surface of a lowermost channel layer among the channel layers.

20. A semiconductor device comprising:

insulating patterns spaced apart from each other;

channel layers on the insulating patterns and spaced apart from each other;

gate structures vertically overlapping the insulating patterns and surrounding each of the channel layers;

source/drain regions provided outside the gate structures; and backside contact structures electrically connected to the source/drain regions below the source/drain regions, wherein the insulating patterns comprise protrusions partially penetrating through lower portions of the gate structures, and wherein, in a region in which the insulating patterns vertically overlap the gate structures, a vertical distance between a lower surface of a lowermost channel layer among the channel layers and an upper surface the protrusions is greater than a vertical distance between the channel layers.

* * * * *